United States Patent
Yoshioka et al.

[11] Patent Number: 6,117,706
[45] Date of Patent: Sep. 12, 2000

[54] PRINT CIRCUIT BOARD

[75] Inventors: Hirokazu Yoshioka, Osaka; Norio Yoshida, Nara; Kenichiro Tanaka; Jun Tatsuta, both of Osaka, all of Japan

[73] Assignee: Matsushita Electric Works, Ltd., Osaka, Japan

[21] Appl. No.: 09/085,481

[22] Filed: May 27, 1998

[30] Foreign Application Priority Data

Jul. 28, 1997 [JP] Japan ................................ 9-218272
Apr. 23, 1998 [JP] Japan ................................ 10-131098

[51] Int. Cl.$^7$ .................................................. H01L 21/44
[52] U.S. Cl. .............................. 438/106; 438/313; 437/96
[58] Field of Search ...................... 438/106, 313; 427/96

[56] References Cited

U.S. PATENT DOCUMENTS

| | | | |
|---|---|---|---|
| 5,219,607 | 6/1993 | Lawakami et al. ........................ 427/96 |
| 5,357,674 | 10/1994 | Lumbard ................................. 29/843 |
| 5,494,781 | 2/1996 | Ohtani et al. ........................... 430/313 |

*Primary Examiner*—Richard Elms
*Assistant Examiner*—Pho Luu
*Attorney, Agent, or Firm*—Fish & Richardson P.C.

[57] ABSTRACT

The printed circuit board comprises a substrate 1 including a part loading portion 3 into which an electronic part 5 can be loaded, a plurality of contact terminals 2 which are respectively formed on one surface of the substrate 1 and the surfaces of which are exposed to the outside to provide external contacts, and openings 4 respectively formed in the other surface of the substrate 1 for insertion of bonding wires 6 which are used to connect the electronic part 5, which are to be loaded into the part loading portion 3 of the substrate 1, to its associated contact terminals 2. In the printed circuit board, each of the contact terminals 2 is formed of a metal foil 9 directly and closely attached to the substrate 1. This can prevent the lowered heat resistance of a printed circuit board which occurs when the metal foil, which is used to form the contact terminals 2, is bonded to the substrate 1 using an adhesive.

12 Claims, 17 Drawing Sheets

PRINT CIRCUIT BOARD

BACKGROUND OF THE INVENTION

1. Field of the Invention

The present invention relates to a printed circuit board, an IC card or CSP (chip scale package) using the printed circuit board, and a method for manufacturing the printed circuit board.

2. Related Art

In manufacturing a printed circuit board, as shown in FIG. 24(a), at first, an adhesive 8 is applied onto one surface of the substrate 1 and, as shown in FIG. 24(b), the substrate 1 is die-cut to thereby form an opening 3a for loading a part therein as well as a plurality of openings 4 for insertion of bonding wires therethrough. After then, as shown in FIG. 24(c), a metal foil 9 such as a copper foil or the like is adhered to one surface of the substrate 1 with the adhesive B. Next, the metal foil 9 is worked by etching or the like for circuit configurations, with the result that, as shown in FIG. 24(d), there are formed contact terminals 2 which provide outer contacts with the surfaces thereof exposed to the outside. By the way, the bottom surface of the part loading opening 3a as well as the respective bottom surfaces of the plurality of bonding wire openings 4 are formed of these contact terminals 2, while each of the contact terminals 2 formed on the bottom surface of the part loading opening 3a also has a function to hold the electronic part 5. After the circuit is configured in this manner, as shown in FIG. 24(e), the portions of the circuit corresponding to the outer surfaces of the contact terminals 2 as well as the portions thereof facing the bottom surfaces of the openings 3a and 4 are respectively plated with Ni and Au to thereby produce two kinds of finishing plating 10a and 10b.

However, each of the contact terminals 2, as described above, is formed of the metal foil 9 adhered to the substrate 1 with the adhesive 8 and, therefore, the contact terminal 2 can peel off when the adhesive 8 is caused to deteriorate due to the action of high temperatures; that is, the contact terminal 2 raises a problem relating to the heat resistance thereof. Also, the thickness of the printed circuit board is increased by an amount corresponding to the adhesive 8, which makes it difficult to reduce the thickness of the printed circuit board.

Further, because the openings 3a and 4 are formed by die-cutting, there is a limit to reduction in the diameters of the openings 3a and 4 and it is also difficult to reduce the distance between the openings 3a and 4. That is, there is a limit to reduction in the size of the printed circuit board.

Also, when forming the two kinds of finishing plating 10a and 10b respectively on the portion corresponding to the outer surfaces of the contact terminals 2 and the portion facing the bottom surfaces of the openings 3a and 4, such plating operations are executed in the same process. Actually, however, it is difficult to execute such different kinds of plating in the same processs that is, the portion corresponding to the outer surfaces of the contact terminals 2 must be plated with Ni and glossy Au to thereby produce the fishing plating 10a, whereas the portion facing the bottom surfaces of the openings 3a and 4 must be plated with Ni and non-glossy Au to thereby produce the fishing plating 10b.

On the other hand, the circuit board manufacturing process for CSP is described in Unexamined Japanese Patent Publication Hei 4-3676.

However, this technique has a problem such that when forming an opening (which corresponds to the term "opening" disclosed in the present application) extending up to the surface of a circuit pattern such as a connecting terminal, there is used a carbon dioxide laser. However, due to use of the carbon dioxide laser, the resin forming the substrate cannot be removed completely. Also, when a plated conductor is formed on the circuit pattern surface, or when the plated conductor is connected to the circuit pattern surface by soldering or by wire bonding, such connection provides a low connecting reliability.

SUMMARY OF THE INVENTION

As described above, it is an object of the present invention provide a printed circuit board having a high connecting reliability of a gold wire bonding or a solding connection at a surface of a metal foil at opening side.

Namely, an ultraviolet laser is applied at the surface of the metal foil at the opening side so as to eliminate residual refuse such as a resin or the like remaining on the surface of the foil and so as to eliminate a surface layer having a bonding uneven portion. As a result a smoothing surface could be obtained. Due to obtaining the smoothing surface, when this circuit board is used for IC card, it could be obtained a high wire (gold wire) bonding strength, and when this circuit board is used for CSP, it could be obtained a high connecting strength of a solder ball. As a result, there is provided the print circuit board with the high connecting reliability.

It is another object of the invention to provide a printed circuit board which can secure a high connecting strength in the surface of the opening side of a metal foil when it is connected by metal wire bonding or by soldering.

And, when the present printed circuit board is used as a printed circuit board for an IC card, it is highly heat resistant and compact in size, as well as it is improved in the freedom of plating in the contact terminals.

According to a first aspect of the present invention, there is provided a method for manufacturing a printed circuit board including a substrate including a part loading portion into which an electronic part to be loaded;

a plurality of circuit patterns respectively formed on one surface of the substrate, and the surfaces of said circuit patterns exposed to the outside to serve as external contacts, and each of the circuit patterns formed of a metal foil directly and closely attached to the substrate; and openings, respectively formed in the other surface of the substrate, for connecting the electronic part to the circuit patterns, comprising the steps of;

forming the openings by one of an optical beam and sandblasting in the substrate on the back surface side of the contact terminal; and applying an ultraviolet laser at the surface of the metal foil at the opening side so as to eliminate a residual refuse.

According to the second aspect of the present invention, the opening is for insertion of a bonding wire.

According to the third aspect of the present invention, the opening is for filling with a solder to form a solder ball.

According to the fourth aspect of the present invention, as an optical laser, there is used a $CO_2$ laser.

According to the fifth aspect of the present invention, there is used a substrate with both surfaces thereof coated with metal foils, and, after one metal foil is etched to thereby form an opening, a $CO_2$ laser having a beam larger in diameter than the opening is radiated onto the opening portion to thereby form openings in the substrate.

According to the sixth aspect of the present invention, there is used a substrate with a close contact surface thereof coated with an oxidation treated metal foil or close a contact surface thereof performed with roughness treatment with an oxidation treaded metal foil.

According to the seventh aspect of the present invention, in order to form the openings by irradiating $CO_2$ laser on one surface of the substrate, the surface of the metal foil on the other surface of the substrate includes at least one of a heat sink or a cooling tube.

According to the eighth aspect of the present invention, when a $CO_2$ laser is radiated onto the substrate to thereby form the openings, a beam attenuating filter is disposed in the center of the beam optical path.

According to the ninth aspect of the present invention, the excimer laser is applied to the openings while monitoring the reflected light thereof.

According to the tenth aspect of the present invention, the openings are treated with plasma.

According to the eleventh aspect of the present invention, the openings are treated by sandblasting.

According to the twelfth aspect of the present invention, there is used a substrate with metal foils coated thereon, one or more of SHG-YAG laser, THG-YAG laser, SHG-YLF laser, and THG-YLF laser are applied to the substrate to thereby form openings, and the metals foils are worked for circuit configuration to thereby form contact terminals.

BRIEF DESCRIPTION OF THE DRAWINGS

FIGS. 2(a) to (e) are respectively section views of the printed circuit board in steps respectively employed in the present embodiment;

FIG. 5(a) is a section view thereof, FIG. 5(b) is a plan view thereof, and FIG. 5(c) is a graphical representation of a relationship between a beam diameter and power;

FIGS. 20(a) to (c) are respectively section views of the respective steps employed in the fourth embodiment of a printed circuit board manufacturing method;

FIGS. 22(a) to (e) are respectively section views of the respective steps employed in the fourth embodiment of a printed circuit board manufacturing method;

DETAILED DESCRIPTION OF THE PREFERRED EMBODIMENTS

Figure 1:
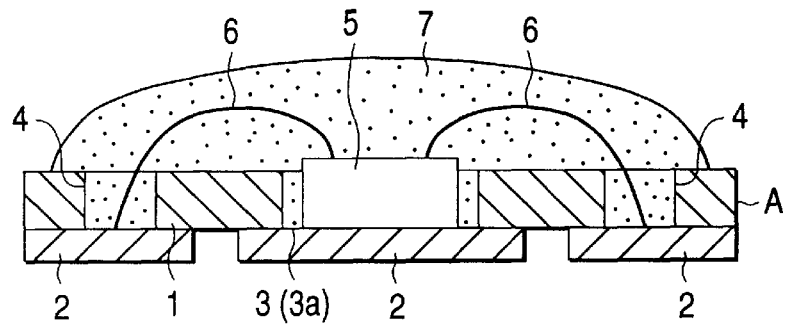
FIGS. 1(a) and (h) show an embodiment of a printed circuit board for a IC card; in particular, FIGS. 1(a) and (h) are respectively section views thereof.
FIGS. 1(c) and (c) show an embodiment of a printed circuit board for CSP; in particular, FIGS. 1(c) and (d) are respectively section views thereof.
Figure 1:
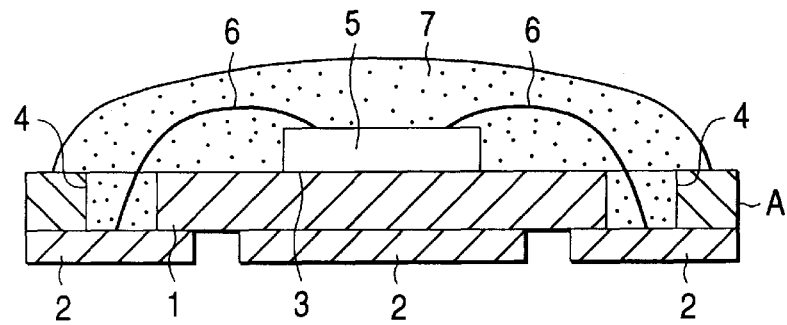
Figure 1:
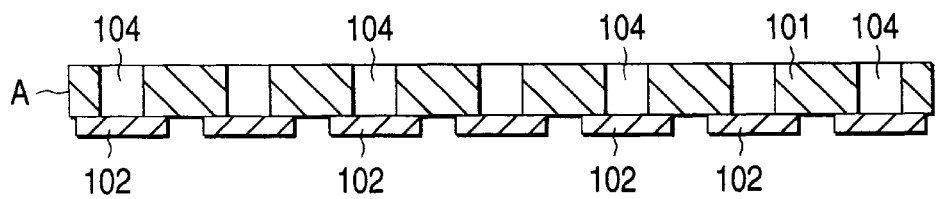
Figure 1:
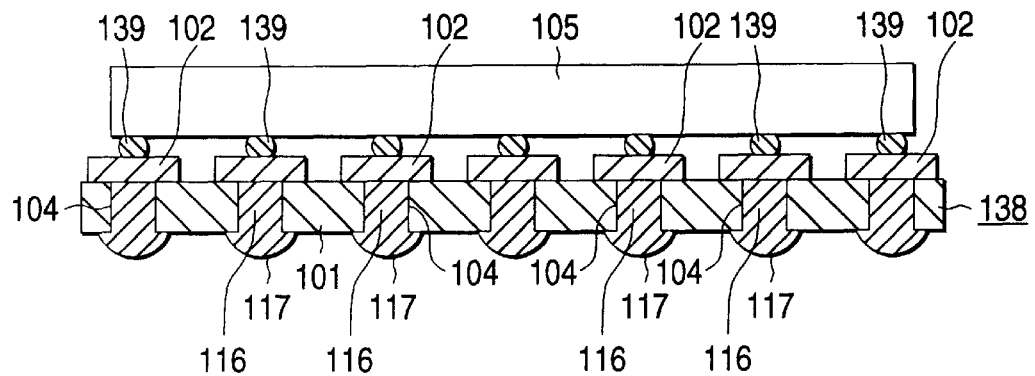

As a printed circuit board for use in a small package, a CSP (chip scale package) and the like having substantially the same size as a semiconductor chip 105 such as an IC or the like, there is known a printed circuit board having such a structure as shown in FIG. 1(c). In this structure, terminals 102 are formed on one surface of a substrate 1 and there are formed openings 104 in the substrate 1 in such a manner that the terminals 2 provide the bottom surfaces of the openings 104.

And, solders 116 are respectively loaded into the openings 104 and are thereby closely contacted with the terminals 102 on the bottom surfaces of the openings 4 and, at the same time, the solders 116 are partially projected as balls 117 through the opening portions of the openings 104 up to the surface of the substrate 101, thereby being able to form such a CSP 138 as shown in FIG. 1(d). After then, if the bumps 39 of the semiconductor chip 105 such as an IC or the like are connected to the respective terminals 102 by soldering or by similar connecting means, then the semiconductor chip 105 can be mounted into the CSP.

As a printed circuit board for use in an IC card or the like, there is proposed a printed circuit board having such a structure as shown in FIG. 1(a). In this printed circuit board, a plurality of contact terminals 2 are provided on one surface of a substrate 1; part loading openings 3a and bonding wire openings 4 are formed in the substrate 1 in such a manner that the contact terminals 2 respectively provide the bottom surfaces of these openings 3a and 4; an electronic part 5 such as an IC or the like is loaded into the part loading opening 3a; and, the electronic part 5 is connected to the contact terminals 2 by bonding wires 6 through the bonding wire openings 4. And, further, sealing resin is potted to thereby seal the substrate 1, so that the thus produced printed circuit board can be used as a module for an IC card.

Now, description will be given below of the preferred embodiments of the invention with reference to the accompanying drawings.

According to the invention, as a substrate 1, as shown in FIG. 2(a), there is used a resin layer-built plate 1a with both surfaces thereof coated with metal foils 9 and 9 such as copper foils or the like. The both-face metal coated resin layer-built plate 1a can be manufactured in the following manner: that is, for example, a substrate formed of glass fiber such as glass cloth or the like is impregnated with thermosetting resin varnish such as epoxy resin or the like to thereby produce a resin impregnated substrate, two or more pieces of such resin impregnated substrates are superimposed on top of each other according to cases and both sides of them are sandwiched by and between the metal foils 9 and 9, they are moved through rollers (pressurization by the rollers is not necessary) while they are being heated to thereby harden the resin of the resin impregnated substrate, with the result that the metal foils 9 and 9 are layered and attached integrally to the resin impregnated substrate by means of the hardened resin. That is, the resin layer-built plate 1a can be manufactured in such a manner that the metal foils 9 are formed integrally on the surfaces of both sides of the substrate 1 formed of the resin impregnated substrate. For example, the resin layer-built plate 1a can be manufactured in such a manner that the metal foils (copper foils) 9 having a thickness of 18 μm are formed integrally on both surfaces of a glass epoxy substrate 1 having a thickness of 100 μm to thereby produce a layered plate. The both-side metal coated resin layer-built plate 1a can be used as the substrate 1 which is higher in the surface smoothness and more excellent in the thickness uniformity than a layered plate which is produced without building the metal foils 9 on both surfaces thereof. Also, it should be noted here that the metal foils 9 are not bonded to the substrate 1 using an adhesive but are directly and closely attached to the substrate 1 due to the self-adhering action of the resin contained in the substrate 1.

Here, the substrate 1, which, as described above, contains therein glass fibers such as glass cloth or the like, is excellent in strength, electric insulation, and moisture proof property. Therefore, with use of the substrate 1 containing such glass fibers, there can be manufactured a printed circuit board which is high in strength, electric insulation, and moisture proof property.

Next, an etching resist is bonded to the metal foil 9 coated on one surface (for example, the lower surface) of the substrate 1, whereas no etching resist is bonded to the metal foil 9 coated on the other surface (for example, the upper surface) of the substrate 1. And, after the etching resist is exposed and developed, the two metal foils 9 are respectively etched so that, as shown in FIG. 2(b), the metal foil 9 on one surface of the substrate 1 is processed for circuit configuration to thereby form contact terminals 2 and, at the same time, the metal foil 9 on the other surface of the substrate 1 is removed to thereby expose the surface of the substrate 1.

In the present embodiment, as described above, since the both-surface metal coated resin layer-built plate 1a is used as the substrate 1, when compared with a case in which a layered plate produced without building the metal foils 9 layers on the surfaces thereof, the substrate 1 is higher in the surface smoothness as well as more excellent in the thickness uniformity, which makes it possible to manufacture a high-quality printed circuit board. Also, the contact terminals 2 are formed of the metal foil 9 previously coated on the substrate 1, which eliminates the need for execution of a conventionally used complicated operation that, after the metal foils 9 previously coated on both surfaces of the substrate 1 are removed once prior to formation of the openings 3a and 4, the metal foil 9 used to form the contact terminals 2 is adhered again to the substrate 1. That is, this eliminates the possibility that the manufacturing process can be made long and the material loss can increase. Further, the metal foils 9 are not bonded to the substrate 1 using an adhesive but are closely attached to the substrate 1 directly due to the self-adhering action of the resin contained in the substrate 1, while the contact terminals 2 formed of such metal foil 9 are also directly and closely contacted with the substrate 1, thereby avoiding a problem, which arises in a case in which the metal foils 9 are bonded using an adhesive, that the contact terminals 2 can be deteriorated in heat resistance. Thanks to this, it is possible to manufacture a printed circuit board which is highly resistant against heat. Also, no need for use of an adhesive makes it possible to reduce the thickness of the printed circuit board.

After the metal foil 9 is worked for circuit configuration and the contact terminals 2 are thereby formed on one surface of the substrate 1 in the above-mentioned manner, two or more pieces of finishing plating 10a are respectively formed on the exposed surfaces of the contact terminals 2 in such a manner as shown in FIG. 2(c). The finishing plate 10a can be obtained by plating its associated contact terminal 2 with Ni and, after then, further plating the thus Ni plated contact terminal 2 with glossy Au.

Next, the substrate 1 is worked to thereby form the openings 3a and 4 therein. The working or formation of the openings 3a and 4 can be achieved by applying an optical beam to the substrate 1 from the surface thereof from which the metal foil 9 has been removed, thereby causing the optical beam applied portion of the substrate 1 to disappear.

That is, as shown in FIG. 2(d), the openings 3a and 4 can be formed in such a manner that the contact terminals 2 formed on one surface of the substrate 1 respectively provide the bottom surfaces of the openings 3a and 4. Since the diameter of the optical bundle of the optical beam can be reduced, the openings 3a and 4 can be worked using the small diameter of the optical bundle and, at the same time, the openings 3a and 4 can be worked in such a manner that the distance between them is set small. Therefore, the openings 3a and 4 of small sizes can be formed in the substrate 1 in such a manner that they are disposed in high density, which makes it possible to make compact the printed circuit board.

In this case, as the optical beam, there can be used a $CO_2$ laser. However, since only the treatment using the $CO_2$ laser is not able to expose the surface of the metal foil 9 completely, in the final stage of the treatment, by radiating an excimer laser instead of the $CO_2$ laser, the surface residual dust removing treatment can be executed to a perfect degree. Of course, a treatment using an excimer laser may be carried out from the beginning to thereby form the openings 3a and 4. However, to form the openings 3a and 4 speedily, preferably, the $CO_2$ laser may be used firstly.

By the way, instead of the opening forming step using a $CO_2$ laser, there can also be employed other various steps such as a mechanical working step using sandblasting or cutting, and the like.

In such case, the opening 3a used for mounting an electric parts 5 serves as part loading portion (cavity) 3 described later, and the opening 4a used for passing through a bonding wire serves as a bonding wire openings 4 A plurality of the bounding wire openings 4 are formed such that the bounding wire openings 4 surround the part loading portion 3a. The openings 3a and 4 are formed in such a manner that the gap defined by the part loading portion 3a and the bonding wire openings 4 at the peripheral portion therebetween is not more than the diameter of the bounding wire openings 4. As a result, the arrangement of the openings 3a and 4 is in high density so as to minimize the print circuit board.

Also, since the part loading portion (cavity) 3, into which the electronic part 5 can be loaded, is formed as the opening 3a in this manner and also part loading portion 3 is worked and formed at the same time when the bonding wire openings 4 are worked and formed, not only the number of working operations can be reduced but also, when the electronic part 5 is loaded into the part loading portion 3 in the above-mentioned manner, the electronic part 5 can be stored within the opening 3a to thereby be able to reduce the projection of the electronic part 5 from the surface of the substrate 1, which makes it possible to reduce the size of a printed circuit board for an IC card in which the electronic part 5 is loaded.

As the above-mentioned optical beam, there can be used a $CO_2$ laser. The $CO_2$ laser is easy to control the radiation energy thereof, can facilitate the control of the depths of the openings 3a and 4 when they are worked, can be well absorbed into an insulation material such as epoxy resin or the like, and is difficult to act on the metal foils 9 such as copper foils or the like, that is, it is hard to penetrate the metal foils 9 and it is hard to cause a crack therein. Thanks to these characteristics of the $CO_2$ laser, with use of the $CO_2$ laser, the openings 3a and 4 can be worked while reducing the damage done to them (claim 18). For example, if the beam of a $CO_2$ laser having an output of 1500 W, 300 mJ/pulse is radiated with an energy density of approx. 4 j/mm$^2$ on the working surface, then the openings 3a and 4 can be worked.

Figure 3:
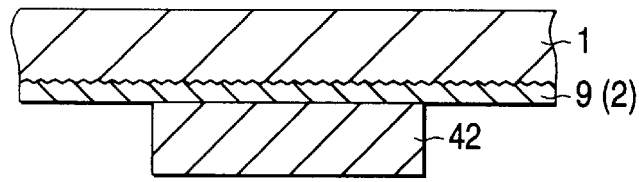
FIGS. 3(a) to (b) show opening forming steps employed in the above-mentioned printed circuit board manufacturing method; in particular, FIGS. 3(a) and (b) are respectively section views thereof.
Figure 3:
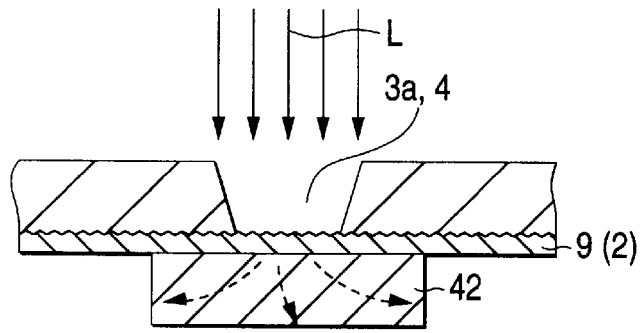

As described above, the $CO_2$ laser is hard to act on the metal foils 9. However, if there is no escape place, there is a fear that the $CO_2$ laser can cause damage to the metal foils 9. In view of this, in an embodiment shown in FIGS. 3(a) and (b), as shown in FIG. 3(a), in the portion of the substrate where the openings 3a and 4 are to be worked, there is provided a heat radiating plate 42 in such a manner that it is in contact with the surface of the metal foil 9 and, as shown in FIG. 3(b), a $CO_2$ laser L is applied onto the substrate 1 to thereby form the openings 3a and 4. As the heat radiating plate 42, there can be used a highly heat conductive metal plate and the like. With use of such heat radiating plate, heat due to the application of the $CO_2$ laser L can be radiated in such a manner as shown by arrows in FIG. 3(b), thereby being able to reduce the heat damage of the metal foil 9.

Figure 4:
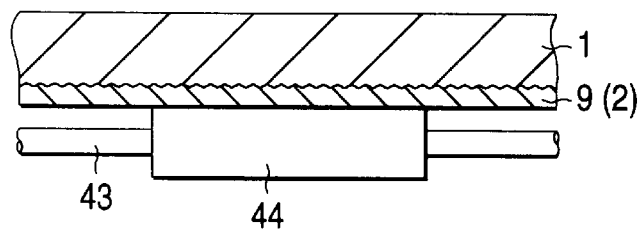
FIGS. 4(a) to (b) show opening forming steps employed in the above-mentioned printed circuit board manufacturing method; in particular, FIGS. 9(a) and (b) are respectively section views thereof.
Figure 4:
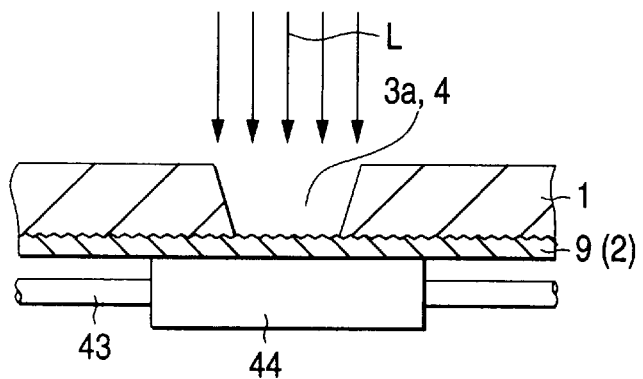
Figure 9:
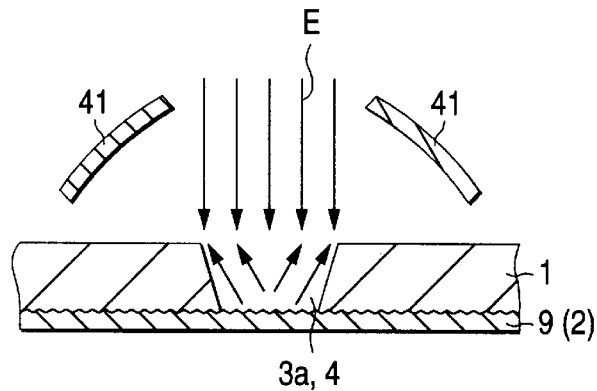
FIG. 9 is a section view of an opening washing step employed in the second embodiment of a printed circuit board manufacturing method.

Also, in an embodiment shown in FIGS. 4(a) and (b), there is used a water cooling tube 44 which is so structured as to allow cooling water to circulate therethrough in cooperation with a cooling water supply pipe 43 connected therewith. In particular, the water cooling tube 44 is disposed in the portions of the substrate 1 where the openings 3a and 4 are to be worked in such a manner that the water cooling tube 44 is in contact with the surface of the metal foil 9 and, after then, as shown in FIG. 9(b), a $CO_2$ laser L is applied onto the substrate 1 to thereby work or form the openings 3a and 4. According to the present embodiment, heat due to the application of the $CO_2$ laser L can be cooled by means of the water cooling tube 44, thereby being able to reduce the heat damage of the metal toil 9.

Figure 5:
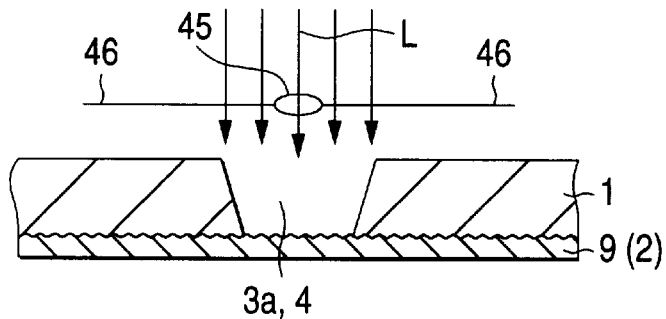
FIGS. 5(a) to (c) show opening forming steps in the above-mentioned printed circuit board manufacturing method; in particular.
Figure 5:
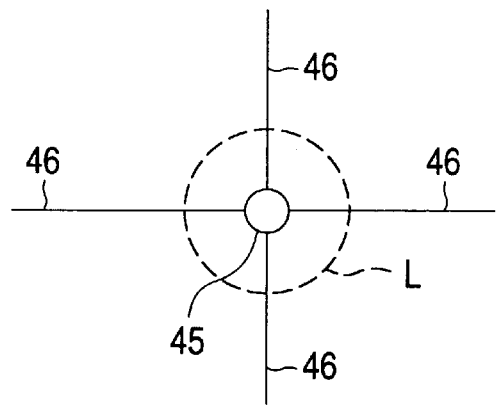
Figure 5:
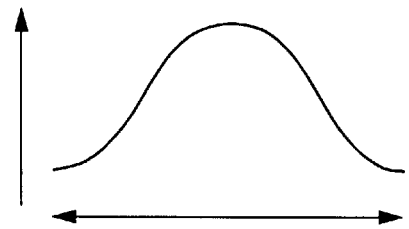
Figure 6:
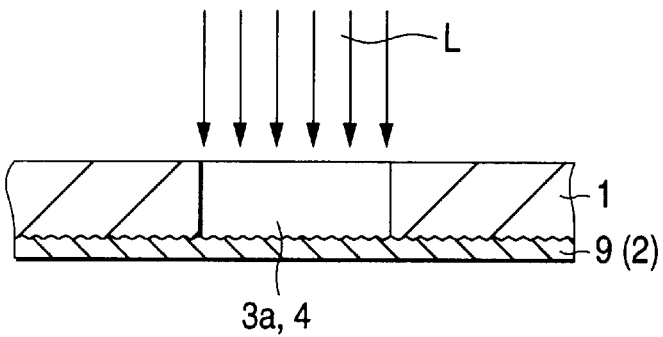
FIG. 6 is a section view of an opening washing step employed in the above-mentioned circuit board manufacturing method.
Figure 7:
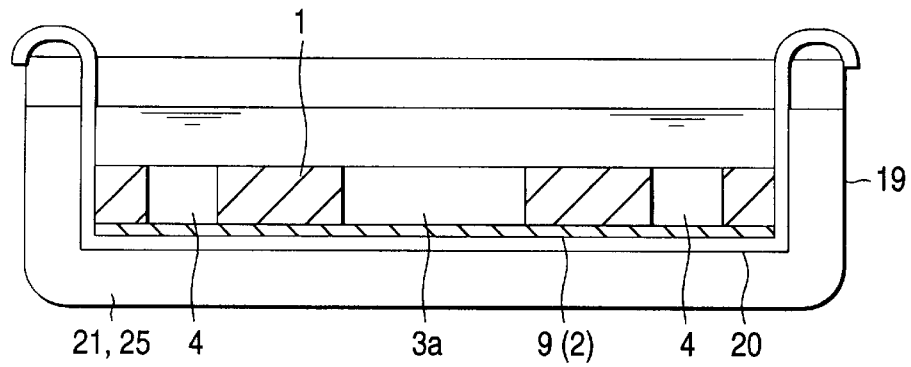
FIG. 7 is a section view of an opening washing step employed in the second embodiment of a printed circuit board manufacturing method.

In working the substrate 1 to form the openings 3a and 4 using the radiation of the $CO_2$ laser as described above, when the beam mode of the carbon dioxide is a single mode, as shown in FIG. 5(c), the central portion of the beam diameter is strong in powers which raises a fear that, in the central portions of the openings 3a and 4, the heat can concentrate on the portions of the metal foil 9 that are situated on the bottom surfaces of the openings 3a and 4 and thus such portions can be damaged. In view of this, in an embodiment shown in FIGS. 5(a) to (c), a beam attenuating filter 45 is disposed in the center of the beam optical path of the $CO_2$ laser L. The beam attenuating filter 45 can be formed of synthetic quartz or the like having a light transmission coefficient of 70–90. In the present embodiment, a beam attenuating filter 45 having a diameter smaller than the beam diameter of the $CO_2$ laser L, as shown in FIGS. 5(a) and (b), is supported by a plurality of metal wires 46 in such a manner that it is situated in the center of the beam optical path of the $CO_2$ laser L (in FIG. 5(b), the range of the beam of the $CO_2$ laser L is shown by a dotted line). That is, while the beam attenuating filter 45 is situated in the center of the beam optical path of the $CO_2$ laser L, if the $CO_2$ laser L is applied to thereby work the substrate 1 to thereby form the openings 3a and 4, then the strong power of the central portion of the beam diameter can be attenuated, which makes it possible to keep the heat from gathering on the portions of the metal foil 9 situated in the central portions of the openings 3a and 4, thereby preventing the metal foil 9 from being damaged due to such heat concentration.

Also, as the metal foils 9 which are superimposed on both sides of the substrate 1, it is preferred to use a metal foil whose contact surface thereof to be contacted with the substrate 1 is oxidation treated. In particular, if the surface of the metal foil 9 such as a copper foil or the like is oxidation treated, then the surface of the metal foil 9 not only can be colored in a dark color but also can be roughened. Therefore, the surface of the contact terminal 2, which is formed of such oxidation treated metal foil 9, in close contact with the substrate 1 is colored and roughened.

Figure 11:
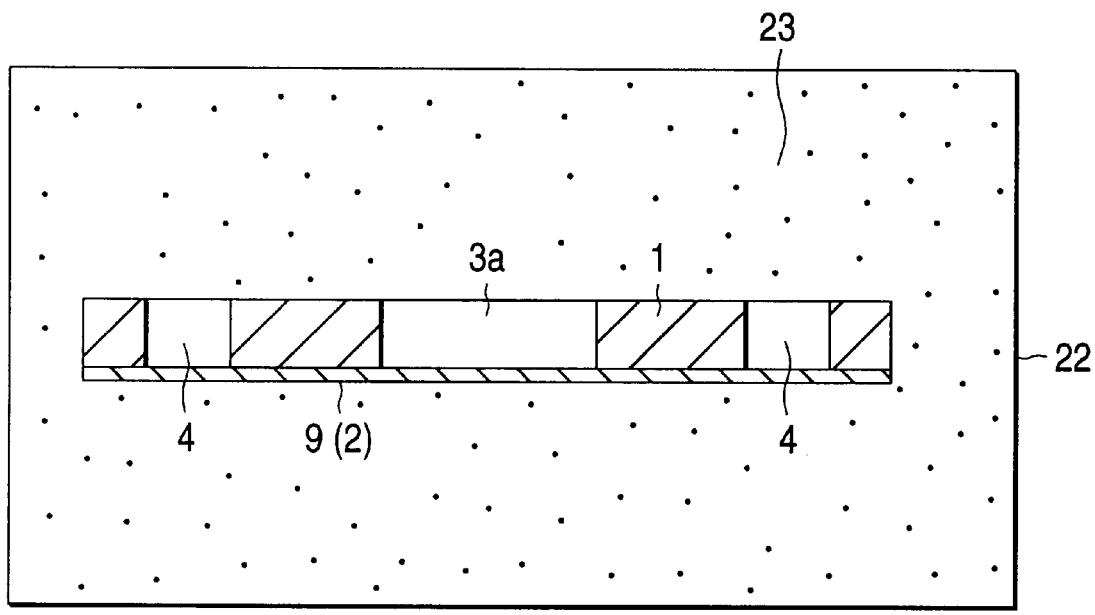
FIG. 11 is a section view of an opening washing step employed in the second embodiment of a printed circuit board manufacturing method.
Figure 12:
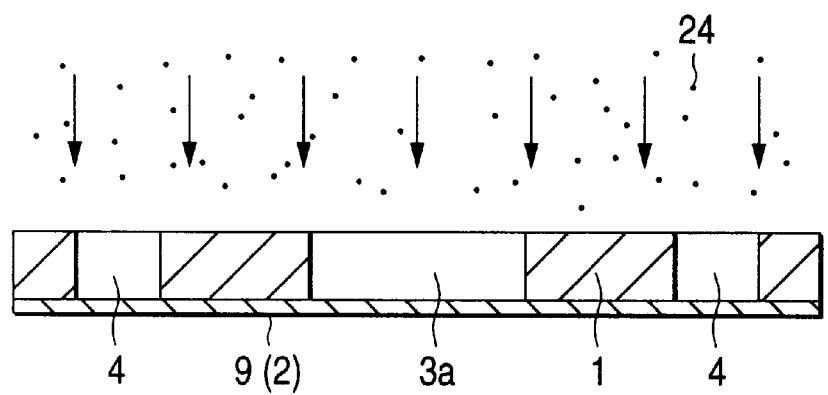
FIG. 12 is a section view of an opening washing step employed in the second embodiment of a printed circuit board manufacturing method.

Due to this, when the CO, laser L is applied to the substrate 1 to thereby work or form the openings 3a and 4 in such a manner as shown in FIG. 11, the reflectance of the Co, laser L on the surface of the contact terminal 2 is lowered, which makes it possible to raise the temperatures of the portions of the substrate 1 that are situated near the contact terminals 2, thereby being able to reduce a possibility that the resin un-removed by the $CO_2$ laser L can be left in the bottom portions of the openings 3a and 4.

Besides the metal foil 9 having an oxidation treated surface to be closely contacted with the substrate 1, there can also be used another type of metal foil 9 in which its surface to be closely contacted with the substrate 1 is roughened. The roughening treatment can be achieved, for example, by using an etching water solution of 2% copper chloride and 7% hydrochloric acid at a temperature of 30° C. and immersing the metal foil 9 in the etching water solution for 30 minutes. That is, in the case of the contact terminal 2 which is formed of the thus treated metal foil 9, the surface thereof that is closely contacted with the substrate 1 is roughened. Similarly to the above case, when the $CO_2$ laser L is applied to the substrate 1 to thereby work the same and form the openings 3a and 4 therein, the reflectance of the $CO_2$ laser L on the surface of the contact terminal 2 is low, which raises the temperatures of the portions of the substrate 1 that are situated near the contact terminals 2, thereby being able to reduce the possibility that the resin un-removed by the $CO_2$ laser L can be left in the bottom portions of the openings 3a and 4.

As described above, when the openings 3a and 4 are formed by means of radiation of the optical beam, there is a fear that the resin layer can he left in the openings 3a and 4. Especially, when the $CO_2$ laser is used as the optical beam, a resin layer having a thickness of the order of $1\mu$ is easy to remain due to the influence of the laser wavelength. In view of this, after the substrate 1 is worked by radiating the optical beam thereunto to thereby form the openings 3a and 4 respectively including bottom surfaces formed by the contact terminals 2, the side surfaces and bottom portions of the openings 3a and 4 are washed to thereby not only remove the resin left on the surfaces of the contact terminals 2 which provide the bottom surfaces of the openings 3a and 4 but also remove the resin left on the side surfaces of the openings 3a and 4 as well as in the periphery of the openings 3a and 4. This can enhance a connecting reliability when, as will be discussed later, the bonding wires 6 are bonded to the contact terminals 2 through the openings 4 and, at the same time, can enhance a loading reliability when the electronic part is loaded into the opening 3a which is used as the part loading portion 3.

Figure 15:
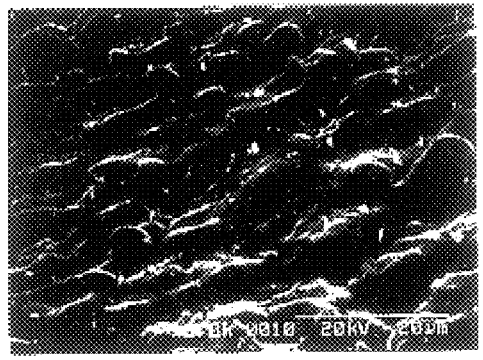
FIG. 15(a) is an SEM picture obtained when the bottom surface of an opening shown in FIG. 13(b) is photographed.
FIG. 15(b) is an SEM picture obtained when the bottom surface of an opening shown in FIG. 13(c) is photographed.
FIG. 15(c) is SEM picture obtained when the bottom surface of an opening shown in FIG. 13(d) is photographed.
Figure 15:
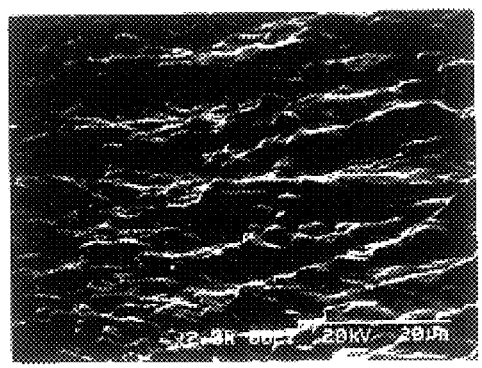
Figure 15:
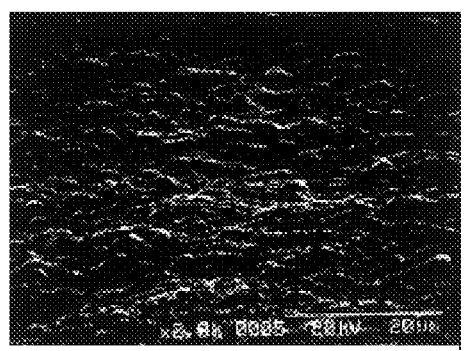

The above-mentioned washing for removing the residual resin on the side surfaces and bottom surfaces of the openings 3a and 4 can be achieved by treating the openings 3a and 4 with a potassium permanganate solution. In particular, to execute the washing, the substrate 1 with the openings 3a and 4 formed therein, as shown in FIG. 15, may be put into a basket 20 or the like and may be then immersed in a potassium permanganate solution 21 stored in a treating vessel 19. For example, at first, the substrate 1 is immersed in the MLB211 solution, which is produced by Sipray Inc. and is adjusted to a temperature of 80° C., for five minutes and is thereby swollen. After then, the substrate 1 is immersed into a solution containing potassium permanganate therein, in particular, the MLB 213 solution which is also produced by Sipray Inc. and is heated up to a temperature of 80° C. for five minutes and is thereby oxidized and decomposed. Next, after it is washed by water, the substrate 1 is immersed in a 10% sulfate solution for five minutes to thereby neutralize the treating residual. After then, in a process for washing the substrate 1 further, the substrate 1 is treated with a potassium permanganate solution.

Figure 16:
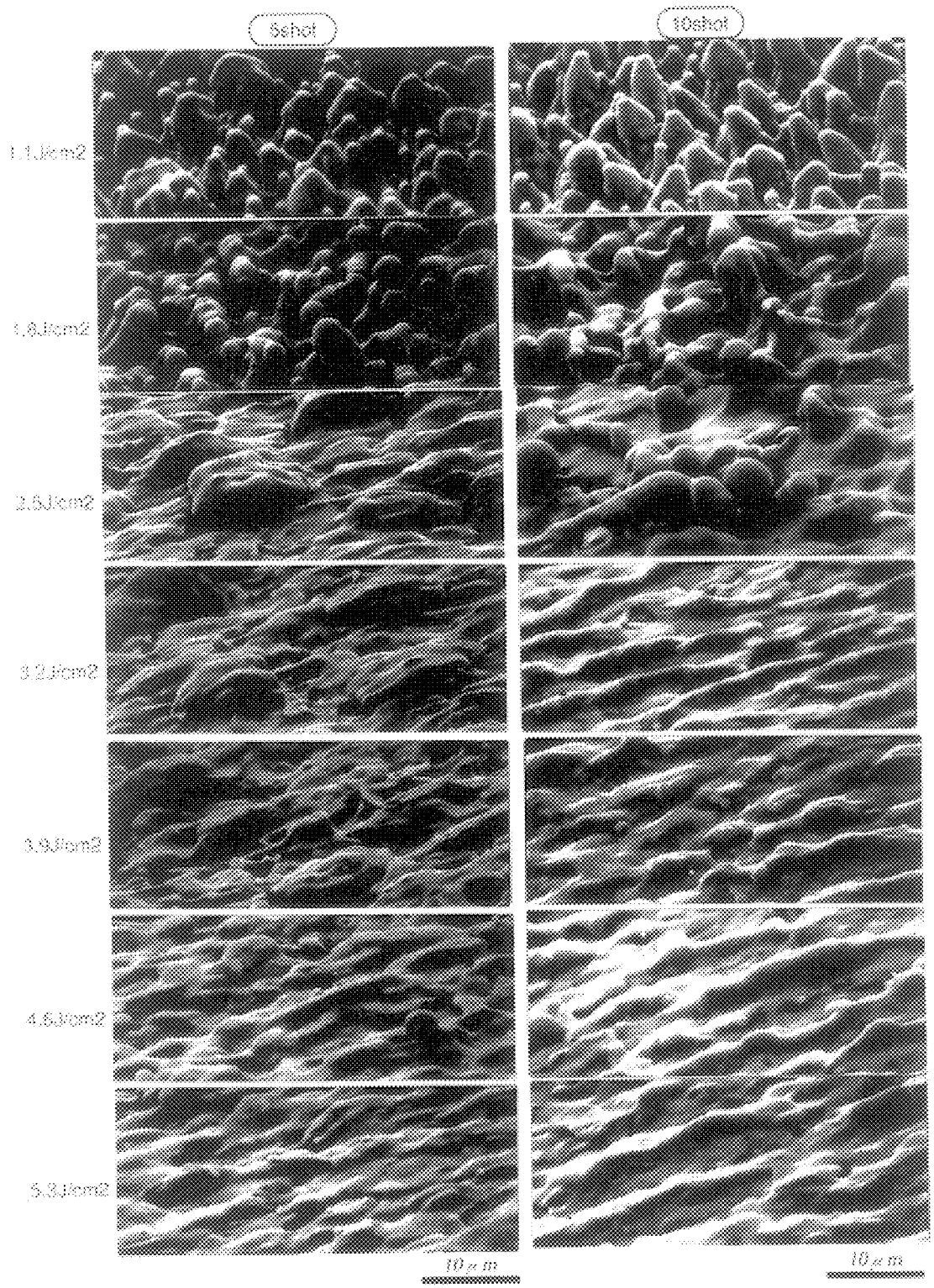
FIG. 16 is an SEM picture obtained when, after an opening formed in the substrate is treated by radiating an excimer laser, the bottom surface of the opening is photographed.

Also, the process for removing the residual resin on the side surfaces and bottom surfaces of the openings 3a and 4 can also be achieved by radiating an excimer laser onto the openings 3a and 4. For example, the washing can be carried out, as shown in FIG. 16, by radiating an excimer later E onto the openings 3a and 4 under the following conditions: that is, a working energy density is 3.0 $mJ/cm^2$/pulse, a repetition frequency is 100 Hz, and 10 shots. In this method for washing the side surfaces and bottom portions of the openings 3a and 4 by radiating the excimer laser onto them, by selecting the portions to be radiated by the excimer laser, the portions to be applied to the process can be selected arbitrarily.

Figure 17:
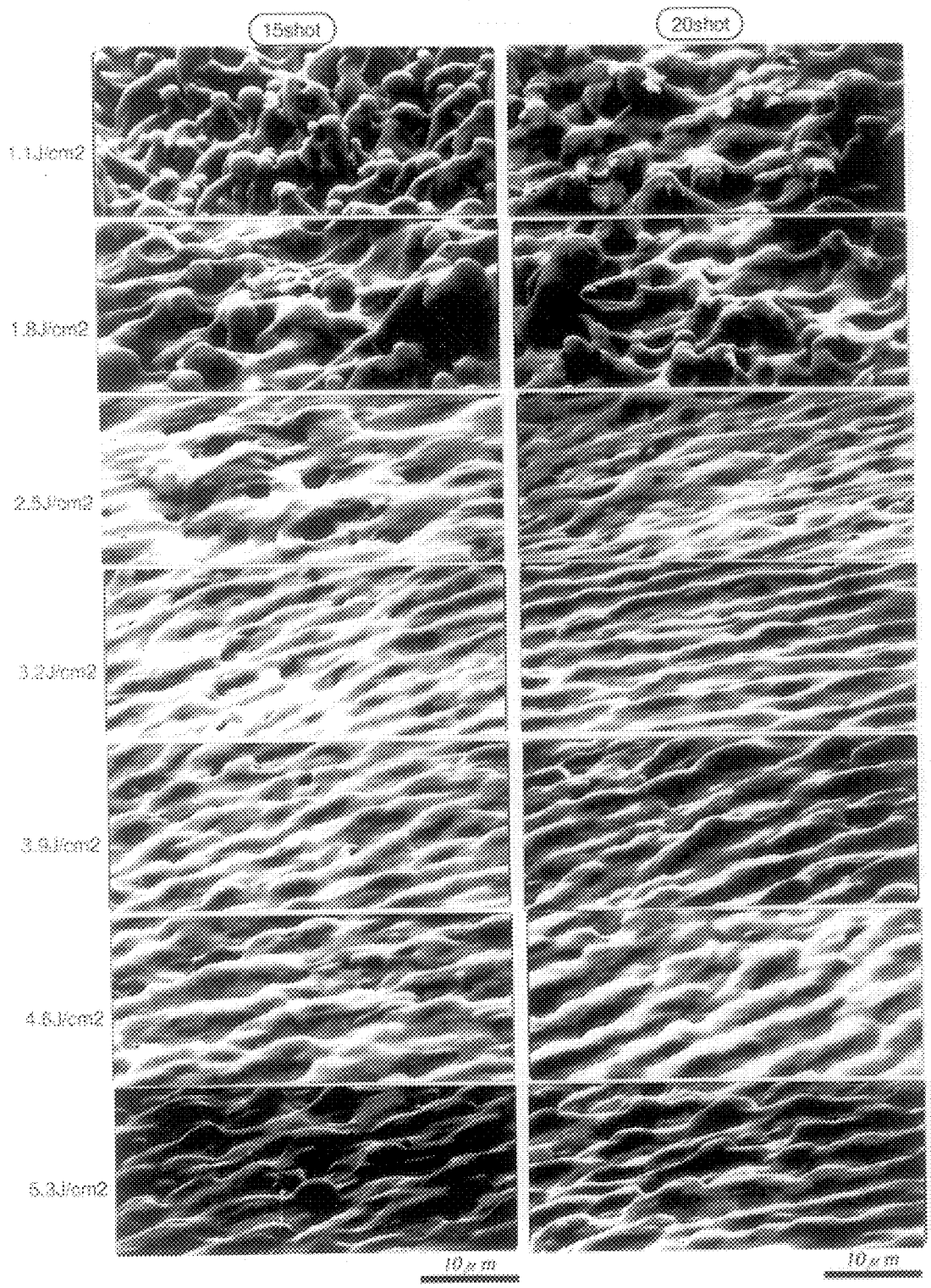
FIG. 17 is an SEM picture obtained when, after an opening formed in the substrate is treated by radiating an excimer laser, the bottom surface of the opening is photographed.

The reflectance of the excimer laser with respect to the metal foil 9 such as a copper foil is generally in the range of 20–30%, and if the excimer laser is reflected by the metal foil 9 on the bottom surfaces of the openings 3a and 4, then the efficiency of removal of the resin is lowered. In view of this, as shown in FIG. 17, reflecting plates 41 are disposed in the peripheries of the portions to be radiated by the excimer laser E; that is, the excimer laser E reflected from the metal foil 9 is reflected by the reflecting plates 41 to thereby allow the excimer laser to be applied to the openings 3a and 4 again, in order to be able to enhance the removal efficiency of the residual refuse. Also, by disposing the reflecting plates 41 in such a manner that they surround the portions to be radiated by the excimer laser E, the leakage of the excimer laser can be restricted and thus safety can be enhanced.

Here, when, as the metal foil (copper foil) 9, there is used a metal foil including a roughened surface to be closely contacted with the substrate 1, the roughened surface of the contact terminal formed of the metal foil 9 is opposed to the bottom surfaces of the openings 3a and 4, which raises a fear of lowering the connecting reliability when the bonding wire 6 is bonded and connected to the contact terminal 2 through the opening 4. On the other hand, since the excimer laser is a short wavelength in the ultraviolet area, it provides a high absorption factor with respect to not only resin but also metal such as copper. Therefore, when the washing for removing the residual refuse within the openings 3a and 4 is carried out by radiating the excimer laser onto the openings 3a and 4 as in the above-mentioned case, at the same time with removal of the residual refuse, the extreme surface layer (having a thickness of the order of 1 $\mu$m) of the metal foil 9 of each of the bottom surfaces of the openings 3a and 4 can be melted to thereby be able to smooth the roughened surface of the metal foil 9 of each of the openings 3a and 4. Also, in addition to the smoothing of the roughened surface of the metal foil 9, the surface of the metal foil 9 can be purified. Further, not only because the excimer laser provides a short wavelength but also because it can be controlled at a working rate in a unit of $\mu$m, use of the excimer laser can reduce the possible damage to the metal foil 9, that is, there can be decreased the possibility that a through hole or a crack can be caused in the metal foil 9.

When carrying out not only the removal of the residual resin in the openings 3a and 4 but also the smoothing and purification of the metal foils 9 on the bottom surfaces of the openings 3a and 4 by radiating the excimer laser onto them, as in the above-mentioned case, preferably, the excimer laser radiation condition may be controlled in the range of 3–10 $J/cm^2$, and 10–30 shots. If the excimer laser radiation is lower in power than this range, that is, if the strength thereof is less than 3 J/cm$^2$ and the number of shots is less than 10, then the smoothing and purification of the metal foils 9 on the bottom surfaces of the openings 3a and 4 cannot be achieved satisfactorily; and, on the contrary, if the excimer laser radiation is higher in power than this range, that is, if the strength thereof is more than 10 J/Cm$^2$ and the number of shots is more than 30, then the smoothing of the metal foils 9 can be achieved but there arises a fear that new uneven portions can be formed in the metal foils 9 due to the influences of the shock waves of such high-power excimer laser.

Figure 10:
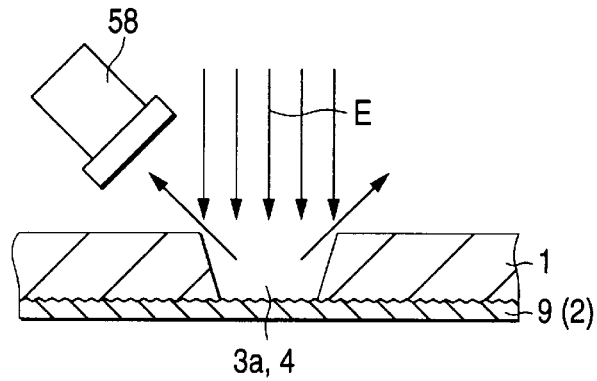
FIG. 10 is a section view of an opening washing step employed in the second embodiment of a printed circuit board manufacturing method.

Also, when carrying out not only the removal of the residual resin in the openings 3a and 4 but also the smoothing and purification of the metal foils 9 on the bottom surfaces of the openings 3a and 4 by radiating the excimer laser onto them, as in the above-mentioned case, preferably, the excimer laser may be radiated while monitoring the reflected light of the excimer laser. The monitoring of the reflected light of the excimer laser can be achieved by using a power meter 58. As shown in FIG. 10, the power meter 58 is disposed in the neighborhood or the radiation portion of the excimer laser E, preferably, the power meter 58 may be set at such a position as prevents the reflected light from being in the shade of the wall surfaces of the openings 3a and 4; and, also, preferably, the power meter 58 may be set at such a position that has a large angle with respect to a surface at right angles to the radiation surface of the excimer laser E. And, in the early stage of the radiation of the excimer laser, since there are still left uneven portions in the surfaces of the metal foils 9 on the bottom surfaces of the openings 3a and 4, the diffused reflection of the excimer laser is large and thus the quantity of the reflected light input to the power meter 58 is large. However, if the radiation of the excimer laser is executed continuously, then the surfaces of the metal foils 9 on the bottom surfaces of the openings 3a and 4 are smoothed due to the melted surface layers of the metal foils 9, so that the diffused reflection of the excimer laser is reduced and thus the quantity of the reflected light input to the power meter 58 is also reduced. That is, if the excimer laser is radiated by monitoring the reflected light of the excimer laser through the power meter 58, then not only the degree of the smoothness of the surfaces of the metal foils 9 on the bottom surfaces of the openings 3a and 4 can be controlled, but also the variations of the degree of the smoothness of the surfaces of the metal foils 9 on the bottom surfaces of the openings 3a and 4 can be reduced.

When not only the residual resin within the openings 3a and 4 are removed but also the metal foils 9 on the bottom surfaces of the openings 3a and 4 are smoothed and purified, it is also preferable to use a short-pulse infrared laser. Since a laser in the general infrared area having a pulse width of a $\mu$sec. order shows a low absorption coefficient with respect to the metal foil 9 such as a copper foil in thermal working, even if such laser is radiated onto the surface of the metal foil 9, most of the laser beam thereof is reflected and the remaining portions of the laser beam ares also thermally diffused within the metal foil 9, which makes it difficult to smooth the surface of the metal foil 9. On the other hand, if a short-pulse infrared laser existing in the infrared area but having a pulse width of $10^{-15} \cong 10^{-12}$ (that is, 1 to 1000 femto-) sec. is used, then not only the laser offers a high peak power but also the state of working is changed from the thermal working to the abrasion working, which makes it possible to work the metal foil 9 such as a copper foil, thereby being able to smooth and purify the metal foils 9 on the bottom surfaces of the openings 3a and 4. As the radiation conditions of the short pulse infrared laser, preferably, $10 \cong 50$ J/cm$^2$ and $10 \cong 50$ shots may be selected and the pulse width may be preferably of the order of $10 \cong 50$ fs.

Figure 19:
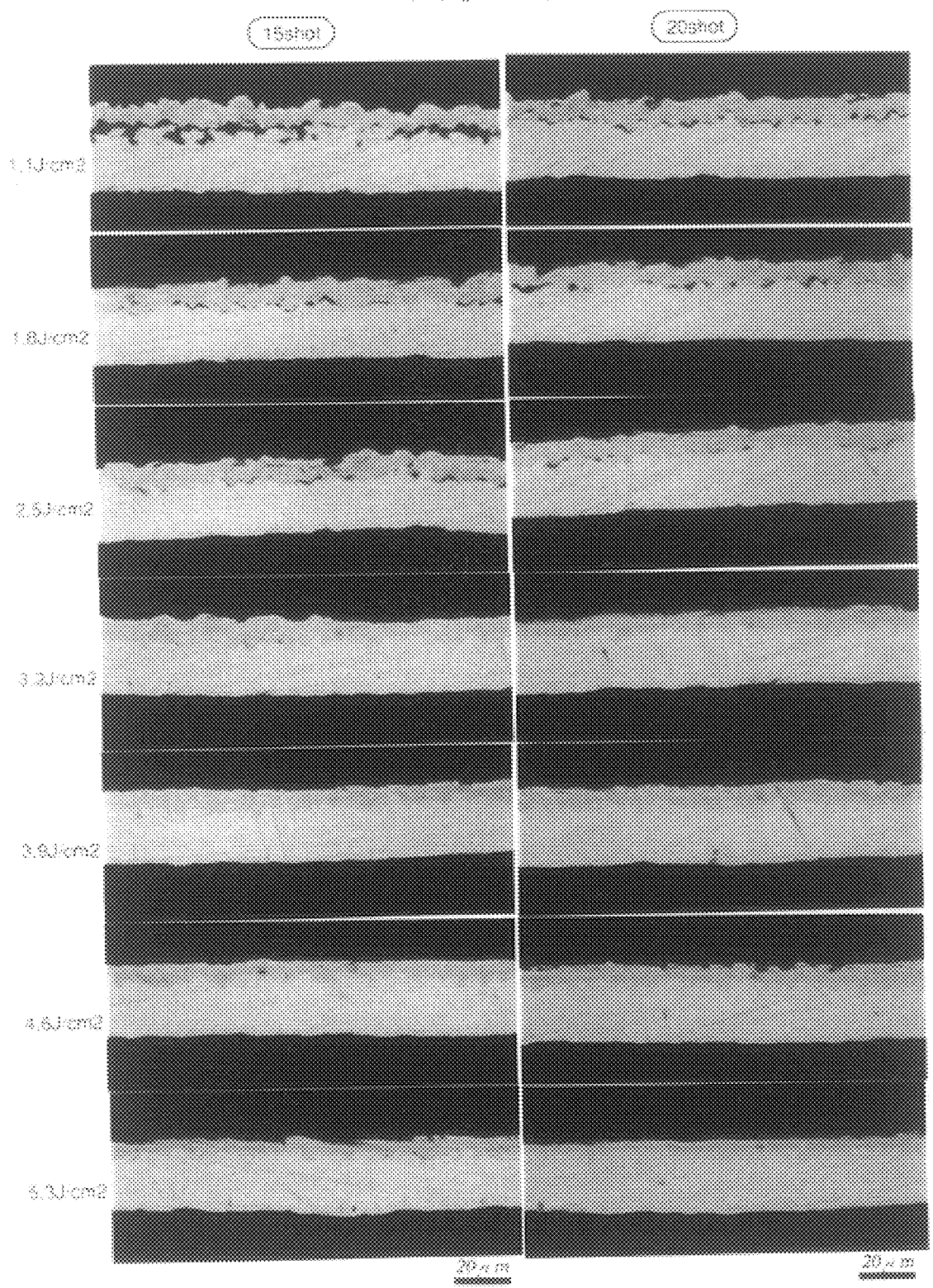
FIG. 19 is an SEM picture obtained when, after an opening formed in the substrate is treated by radiating an excimer laser and a copper foil on the bottom surface of the opening is provided with a finishing plating, the section of the copper foil is photographed.

Also, the washing for removal of the residual resin on the side surfaces of the openings 3a and 4 as well as within the bottom portions of the openings 3a and 4 can also be achieved by treating the openings 3a and 4 with plasma. For example, after a vacuum vessel 22 is evacuated to 0.0001 Torr, a mixed gas consisting of an Ar gas (flow rate; 50 cc/min.) and an oxygen gas (flow rate: 50 cc/min.) is introduced into the vacuum vessel 22, or, as the need arises, a CF$_4$ (flow rate: 50 cc/min.) is additionally introduced into the vacuum vessel 22, thereby setting the pressure of the interior portion of the vacuum vessel 22 for 0.1 Torr. After then, the substrate 1 with the openings 3a and 4 formed therein is placed within the vacuum vessel 22 in such a manner as shown in FIG. 19, and a plasma application power 60 W (having a high frequency of 13.56 MHz) is applied for several minutes to thereby generate plasma 23, so that the side surfaces and bottom portions of the openings 3a and 4 can be washed with the thus generated plasma 23.

Figure 20:
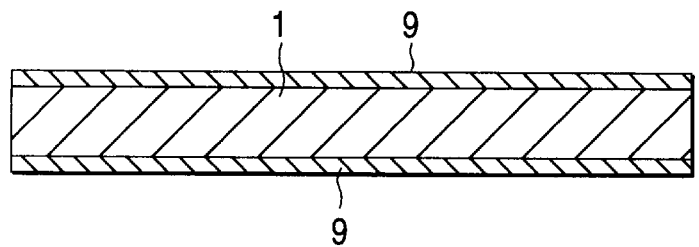
FIGS. 20(a) to (c) show a fourth embodiment of a method for manufacturing a printed circuit board according to the invention; in particular.
Figure 20:
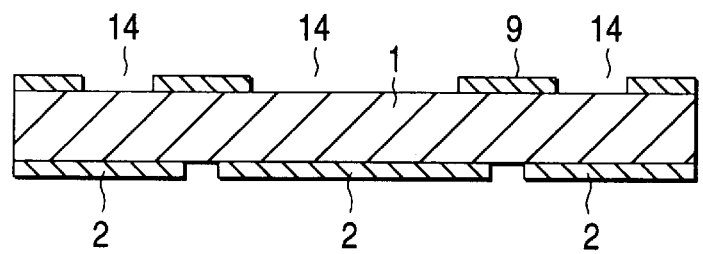
Figure 20:
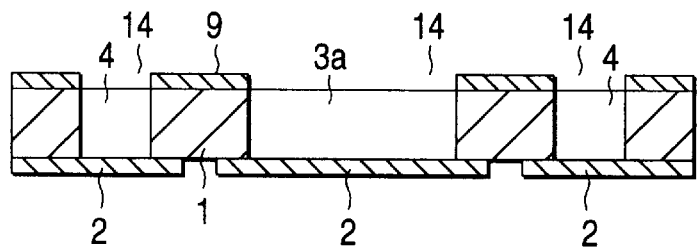

Further, the washing for removal of the residual resin on the side surfaces of the openings 3a and 4 as well as within the bottom portions of the openings 3a and 4 can also be achieved by sandblasting the openings 3a and 4. For example, alumina powder having a particle diameter of 5 $\mu$m is used as abrasives 24, and the abrasives 24 are injected onto the substrate 1 from the side thereof, on which the openings 3a and 4 are opened, for several minutes with an air pressure of 5 kg/cm$^2$ by a sandblasting device, as shown in FIG. 20, thereby achieving the sandblasting treatment of the openings 3a and 4. Since the sandblasting is anisotropic working in which only the surfaces of the openings 3a and 4 that the abrasives 24 collide with are treated or sandblasted, the resin of the inner peripheral surfaces of the openings 3a and 4 can be prevented against damage.

In the steps described above, there is fabricated the print circuit board A of the present invention. The electric parts 5 as IC or the like is loaded in the opening 3a serving as the part loading portion and adheres to the contact terminal 2 (As a result, the contact terminal has a function for holding the electric parts 5). After that, the electric parts 5 and the contact terminal 2 are connected by the bonding wire 6 through the bonding wire opening 4. Then, the seal resin 7 are potted to fabricate the IC card module as shown in FIG. 1(a). In this embodiment, the openings 3a for the part loading portion 3a is formed on the substrate 1. It is applicable for serving the surface of the substrate 1 as the part loading portion 3 so as to mount the electric parts as shown FIG. 1(b) instead of the opening 3a.

Figure 13:
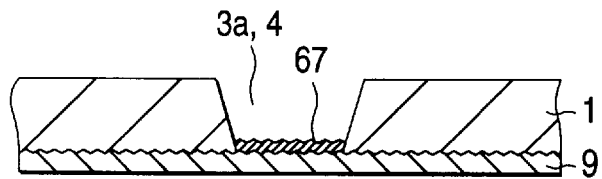
FIGS. 13(a) to (d) show the respective steps employed in a third embodiment of a printed circuit board manufacturing method according to the invention; in particular, FIGS. 13(a), (b), (c) and (d) are respectively section views thereof.
Figure 13:
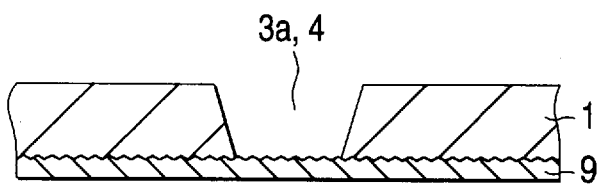
Figure 13:
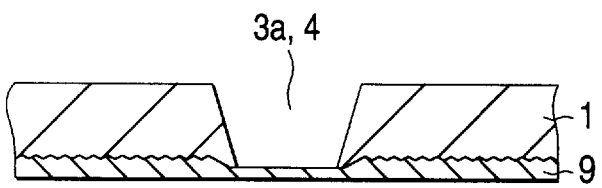
Figure 13:
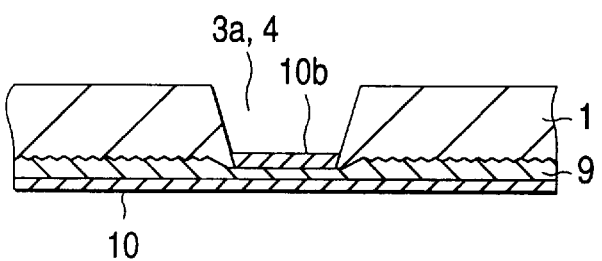
Figure 14:
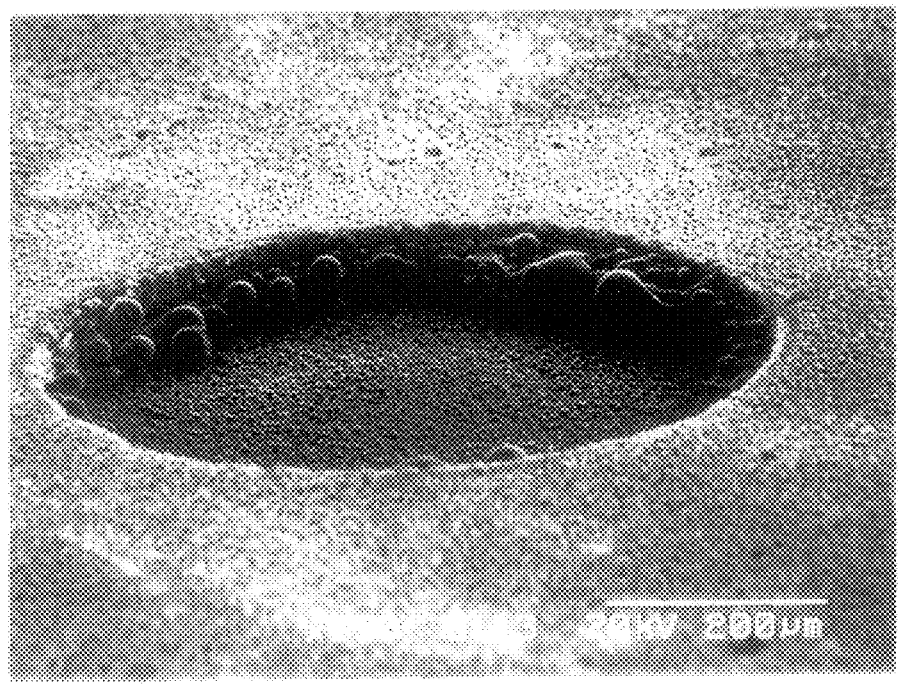
FIGS. 14(a) and (b) are respectively SEM pictures obtained when the bottom surface of an opening shown in FIG. 13(a) is photographed.
Figure 14:
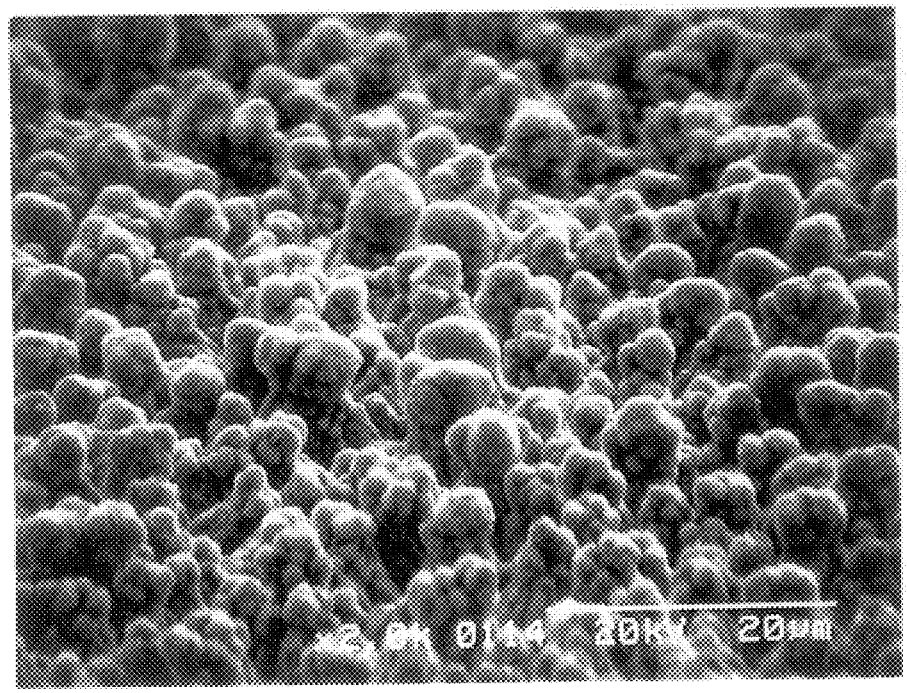

By the way, FIG. 13(a) shows a state in which the substrate 1 is worked using a CO2 laser as an optical beam and under the conditions of working energy of 16.7 mJ/P, an oscillation current value of 13.0 A, a pulse width of 16 $\mu$s, and three shots to thereby form the openings 3a and 4 in the substrate 1, while resin 67 is left in the bottom portions of the openings 3a and 4. Here, the substrate 1 is formed of a glass epoxy layer-built plate having a thickness of 70 $\mu$m, while the metal foil 9 is formed of a copper foil having a thickness of 18 $\mu$m. And, FIG. 14(a) shows a picture taken by a scan type of electronic microscope (SEM) in which the openings 3a and 4 shown in FIG. 13(a) are photographed, and FIG. 14(b) shows another SEM picture in which the openings 3a and 4 are photographed in a further enlarged manner. FIG. 13(b) shows a state in which the residual resin 67 on the bottom surfaces of the openings 3a and 4 is removed by radiating the excimer laser onto the openings 3a and 4, while FIG. 15(a) is an SEM picture in which the bottom surfaces of the then laser-radiated openings 3a and 4 are photographed. Also, FIG. 13(c) shows a state in which the surface of the metal foil 9 on each of the bottom surfaces of the openings 3a and 4 is smoothed by washing the openings 3a and 4 with a hydrochloric acid, while FIG. 15(b) is an SEM picture in which the bottom surfaces of the then acid-washed openings 3a and 4 are photographed. Further, FIG. 13(d) shows a state in which the surface of the metal foil 9 on each of the bottom surfaces of the openings 3a and 4 is provided with a finishing plating 10b consisting of a combination of a Ni plating having a thickness of 1 $\mu$m and an Au plating having a thickness of 0.3 $\mu$m, while FIG. 15(c) is an SEM picture in which the bottom surfaces of the then surface-plated openings 3a and 4 are photographed. As can be seen from the SEM pictures shown in FIGS. 15(a) to (c)., it can be confirmed that the residual resin 67 on the bottom surfaces of the openings 3a and 4 can be removed by the radiation of the excimer laser and, due to the acid washing, not only the surfaces of the metal foils 9 on the bottom surfaces of the openings 3a and 4 can be smoothed but also the state of the finishing plating 10b can be improved.

Figure 8:
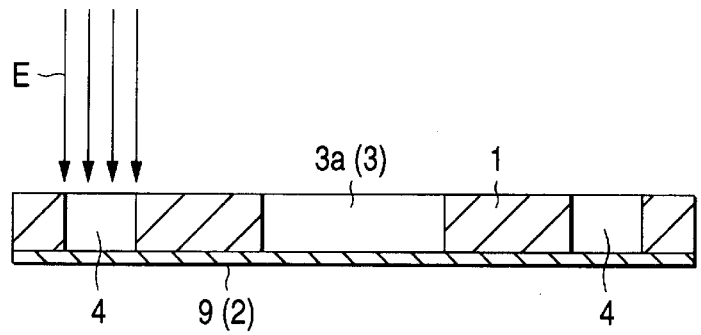
FIG. 8 is a section view of an opening washing step employed in the second embodiment of a printed circuit board manufacturing method.

Also, FIGS. 16 and 17 are respectively SEM pictures in which the states of the surfaces of the metal foils 9 on the bottom surfaces of the openings 3a and 4 are photographed when the openings 3a and 4 of the substrate 1 are radiated by an excimer laser in such a manner as shown in FIG. 8 while the excimer laser radiation conditions are changed. In particular, the pictures on the left side of FIG. 16 respectively show the states of the metal foil 9 surface when it is radiated by the excimer laser by five shots under the conditions of 1.1 $J/cm^2$, 1.8 $J/cm^2$, 2.5 $J/cm^2$, 3.2 $J/cm^2$, 3.9 $J/cm^2$, 4.6 $J/cm^2$, and 5.3 $J/cm^2$ in a descending order; and, the pictures on the right side of FIG. 16 respectively show the states of the metal foil 9 surface when it is radiated by the excimer laser by ten shots under the conditions of 1.1 $J/cm^2$, 1.8 $J/cm^2$, 2.5 $J/cm^2$, 3.2 $J/cm^2$, 3.9 $J/cm^2$, 4.6 $J/cm^2$, and 5.3 $J/cm^2$ in a descending order. Also, the pictures on the left side of FIG. 17 respectively show the states of the metal foil 9 surface when it is radiated by the excimer laser by fifteen shots under the conditions of 1.1 $J/cm^2$, 1.8 $J/cm^2$, 2.5 $J/cm^2$, 3.2 $J/cm^2$, 3.9 $J/cm^2$, 4.6 $J/cm^2$, and 5.3 $J/cm^2$ in a descending order; and, the pictures on the right side of FIG. 17 respectively show the states of the metal foil 9 surface when it is radiated by the excimer laser by twenty shots under the conditions of 1.1 $J/cm^2$, 1.8 $J/cm^2$, 2.5 $J/cm^2$, 3.2 $J/cm^2$, 3.9 $J/cm^2$, 4.6 $J/cm^2$, and 5.3 $J/cm^2$ in a descending order.

Figure 18:
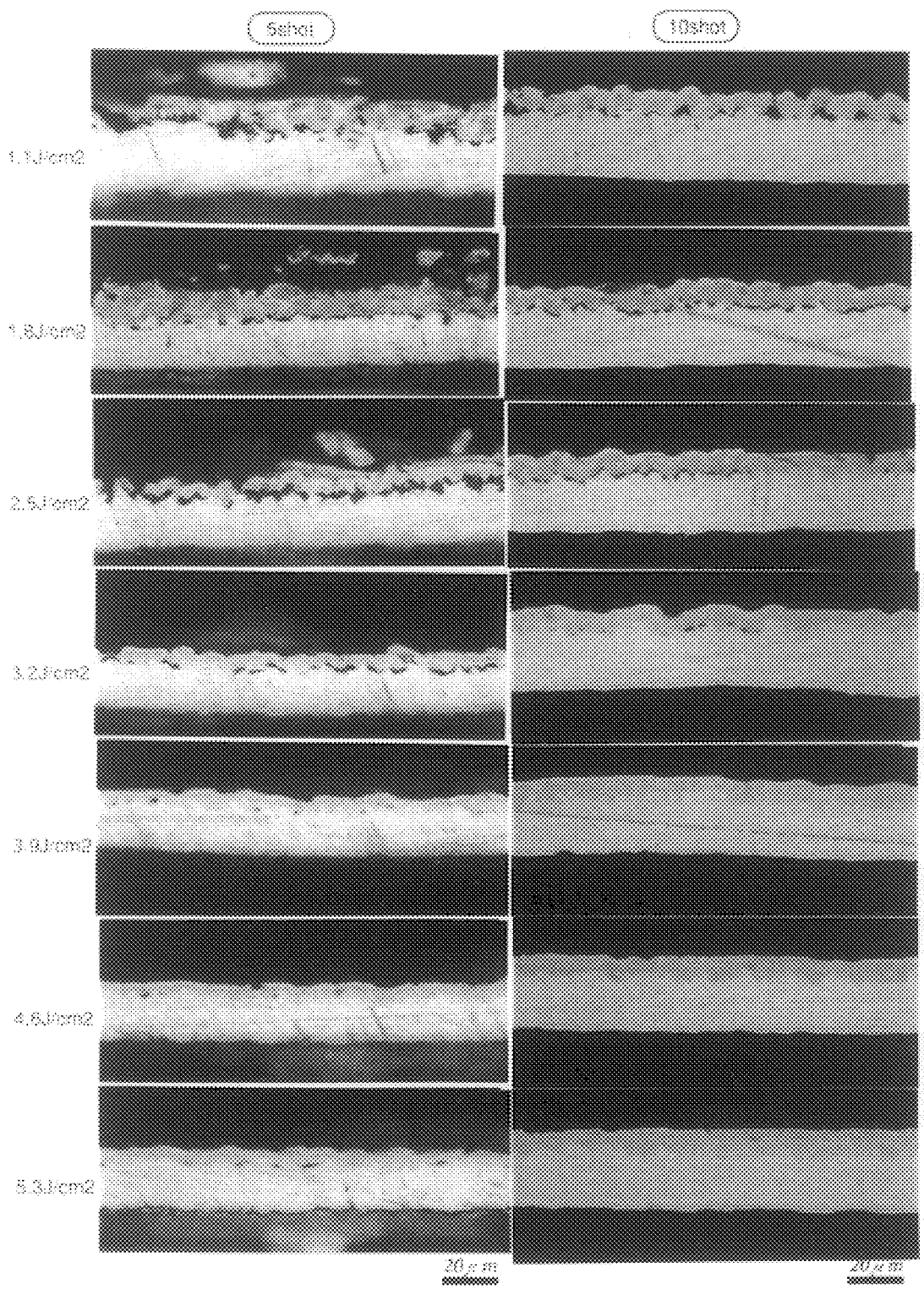
FIG. 18 is an SEM picture obtained when, after an opening formed in the substrate is treated by radiating an excimer laser and a copper foil on the bottom surface of the opening is provided with a finishing plating, the section of the copper foil is photographed.

Further, FIGS. 18 and 19 are respectively SEM pictures in which the states of the section of the metal foil 9 on each of the bottom surfaces of the openings 3a and 4 are photographed when the openings 3a and 4 of the substrate 1 are radiated by an excimer laser in such a manner as shown in FIG. 8 while the excimer laser radiation conditions are changed, and thereafter the surface of the metal foil 9 on each of the bottom surfaces of the openings 3a and 4 is provided with the fishing plating 10b consisting of an Ni plating and an Au plating. In particular, the pictures on the left side of FIG. 18 respectively show the states of the section of the metal foil 9 when it is radiated by the excimer laser by five shots under the conditions of 1.1 $J/cm^2$, 1.9 $J/cm^2$, 2.5 $J/cm^2$, 3.2 $J/cm^2$, 3.9 $J/cm^2$, 4.6 $J/cm^2$, and 5.3 $J/cm^2$ in a descending order; and, the pictures on the right side of FIG. 18 respectively show the states of the section of the metal foil 9 when it is radiated by the excimer laser by ten shots under the conditions of 1.1 $J/cm^2$, 1.8 $J/cm^2$, 2.5 $J/cm^2$, 3.2 $J/cm^2$, 3.9 $J/cm^2$, 4.6 $J/cm^2$, and 5.3 $J/cm^2$ in a descending order. Also, the pictures on the left side of FIG. 19 respectively show the states of the section of the metal foil 9 when it is radiated by the excimer laser by fifteen shots under the conditions of 1.1 $J/cm^2$, 1.8 $J/cm^2$, 2.5 $J/cm^2$, 3.2 $J/cm^2$, 3.9 $J/cm^2$, 4.6 $J/cm^2$, and 5.3 $J/cm^2$ in a descending order; and, the pictures on the right side of FIG. 19 respectively show the states of the section of the metal foil 9 when it is radiated by the excimer laser by twenty shots under the conditions of 1.1 $J/cm^2$, 1.8 $J/cm^2$, 2.5 $J/cM^2$, 3.2 $J/cm^2$, 3.9 $J/cm^2$, 4.6 $J/cm^2$, and 5.3 $J/cm^2$ in a descending order.

As can be seen from FIGS. 16, 17, 18 and 19, by radiating the excimer laser under the conditions of $3 \cong 10$ $J/cm^2$ and $10 \cong 30$ shots, it can be confirmed that the residual resin within the openings 3a and 4 can be removed, the surfaces of the metal foils 9 on the bottom surfaces of the openings 3a and 4 can be smoothed, and the state of the finishing plating 10b can be improved.

Figure 2:
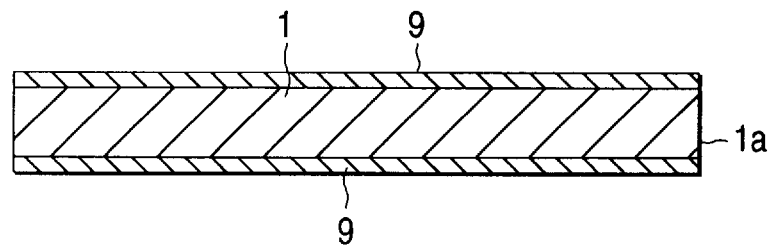
FIGS. 2(a) to (e) show an embodiment of a method for manufacturing a printed circuit board according to the invention; in particular.
Figure 2:
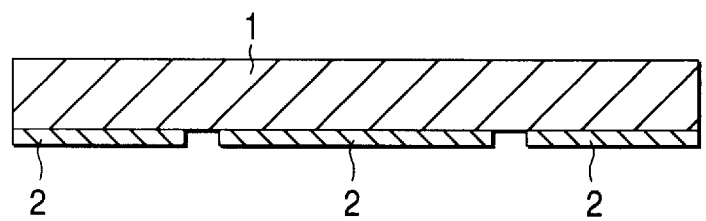
Figure 2:
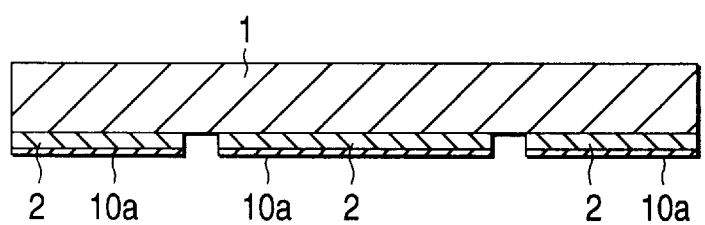
Figure 2:
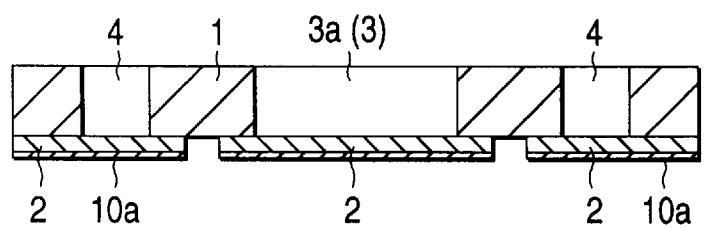
Figure 2:
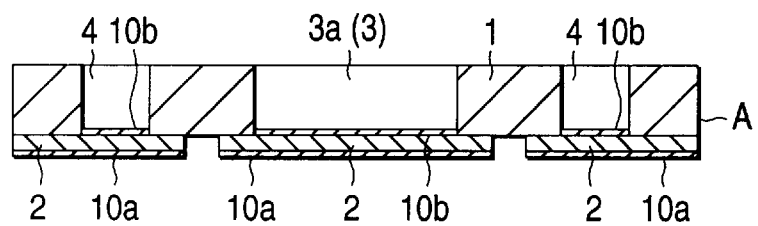

In the previously described embodiment shown in FIG. 2, after the metal foil 9 on one surface of the substrate 1 is worked for circuit configuration to thereby form the contact terminals 2 therein and, at the same time, the metal foil 9 put on the other surface of the substrate 1 is removed by etching, on the surface of the substrate 1 from which the metal foil 9 has been removed by etching, there are formed the openings 3a and 4. On the other hand, in an embodiment shown in FIGS. 20(a) to (c), as shown in FIG. 20(a), there is used a substrate 1 with both surfaces thereof coated with metal foils 9 and 9; etching resists are bonded to the two metal foils 9 and 9 respectively, the two metal foils 9 and 9 are then exposed and developed, and, after then, the two metal foils 9 and 9 are etched respectively, whereby, as shown in FIG. 20(b), the metal foil 9 on one surface of the substrate 1 is worked for circuit configuration to thereby form contact terminals 2 thereon and, at the same time, on the metal foil 9 coated on the other surface of the substrate 1, there are formed openings 14 by etching. The openings 14 are formed at the positions where the openings 3a and 4 are to be formed in the substrate 1 in such a manner that the openings 14 respectively have an opening diameter equal to the diameter of the openings 3a and 4. And, by radiating a $CO_2$ laser onto the substrate 1 which is exposed due to the thus formed openings 14, as shown in FIG. 20(c), the openings 3a and 4 can be formed in the substrate 1.

Figure 21:
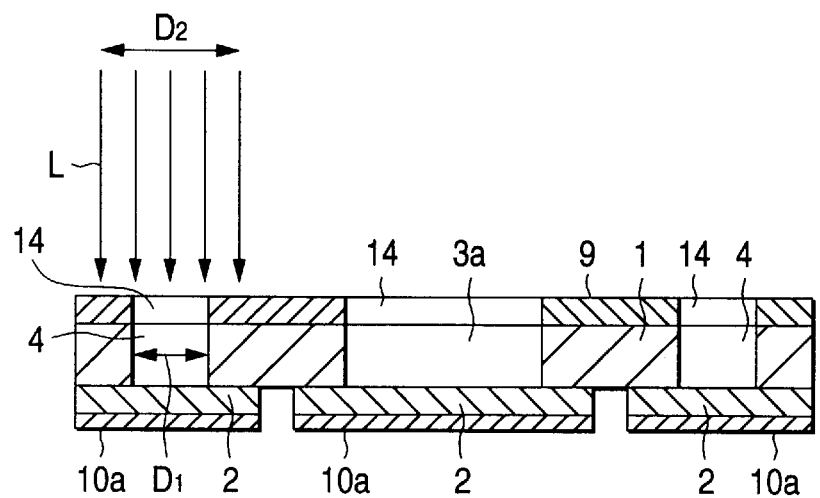
FIG. 21 is a section view of an opening forming step employed in the fourth embodiment of a printed circuit board manufacturing method.

Here, as the $CO_2$ laser, there is used a $CO_2$ laser L the beam bundle of which has a diameter of $D_2$ larger than the diameter $D_1$ of the openings 3a and 4 (the diameter of the opening 14 is also $D_1$). As shown in FIG. 21, even if the $CO_2$ laser L with a beam bundle thereof having the diameter $D_2$ larger the diameter $D_1$ of the openings 3a and 4 is radiated, the peripheral portions of the $CO_2$ laser L are blocked because the metal foils 9 serve as masks and thus only the $CO_2$ laser L that passes through the openings 14 is radiated onto the substrate 1, thereby being able to form the openings 3a and 4 in such a manner that they have the same diameter as the diameter $D_2$ of the openings 14. That is, according to the present embodiment, while eliminating not only the need to use, as the $CO_2$ laser L, a $CO_2$ laser with the beam bundle diameter thereof just the same as the diameter of the openings 3a and 4, but also the need to set the radiation position of the $CO_2$ laser L with accuracy, the high-precision openings 3a and 4 can be formed at the positions of the openings 14 formed in the metal foil 9 1 and with the same diameter as the openings 14.

In the above-mentioned embodiment, as the optical beam, there are used high-frequency YAG laser. In use of the high-frequency YAG laser, the insulation layer of the substrate 1 is eliminated so as to form the openings 3a and 4, and the residual refuse disposed in the openings 3a and 4 is eliminated and the surface of the metal foil 9 at the bottom of the openings 3a and 4 is smoothed at the same time. Specifically, in the third harmonic wave of high-frequency YAG (frequency at 355 nm), the absorbance of the insulation layer of the substrate 1 or the copper foil of the metal foil 9 is superior, and the oscillating power is relatively high so that it is suitable for the treatment of the present invention. Further, the concentration of the beam is in good characteristic so that there is used the treatment for the small diameter. The preferable irradiating condition is that the $10 \cong 50$ J/cm$^2$ and 10 to 50 shots.

Also, in the above-mentioned embodiments, as the optical beam, there are used the $CO_2$ laser and the like. However, as the optical beam, there can also be used other lasers such as an SHG (second harmonic generation)-YAG laser, a THG (third harmonic generation)-YAG laser, an SHG-YLF laser, and a THG-YLF laser. When radiated, the SHG-YAG laser, THG-YAG laser, SHG-YLF laser, and THG-YLF laser can act on the metal foil 9 such as a copper foil or the like. Thanks to this, with use of any one or more of these lasers, the openings 3a and 4 can be formed in the substrate 1 from above the metal foil 9, with no need to remove the metal foil 9 from the substrate 1 (claim 46). Also, with no need for etching or the like, by radiating one or more of the above-mentioned SHG-YAG laser, THG-YAG laser, SHG-YLF laser, and THG-YLF laser, the metal foil 9 can be worked for circuit configuration to thereby form the contact terminals 2 thereon.

Figure 22:
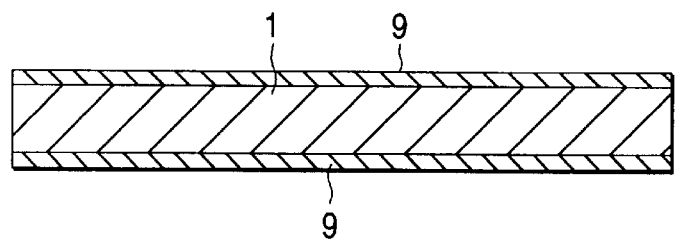
FIGS. 22(a) to (e) show a sixth embodiment of a method for manufacturing a printed circuit board according to the invention; in particular.
Figure 22:
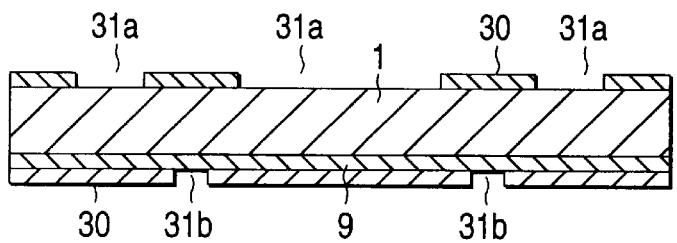
Figure 22:
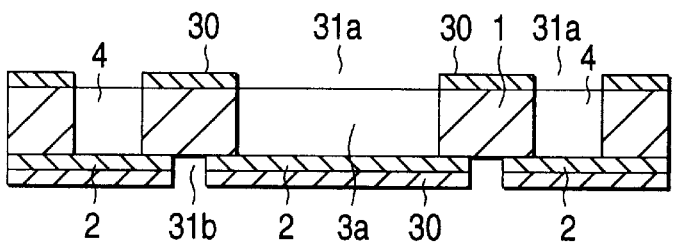
Figure 22:
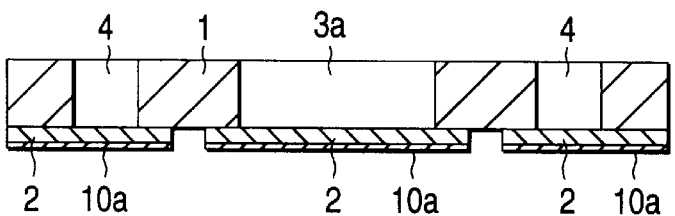
Figure 22:
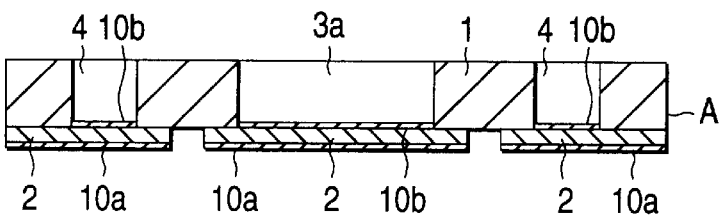
Figure 23:
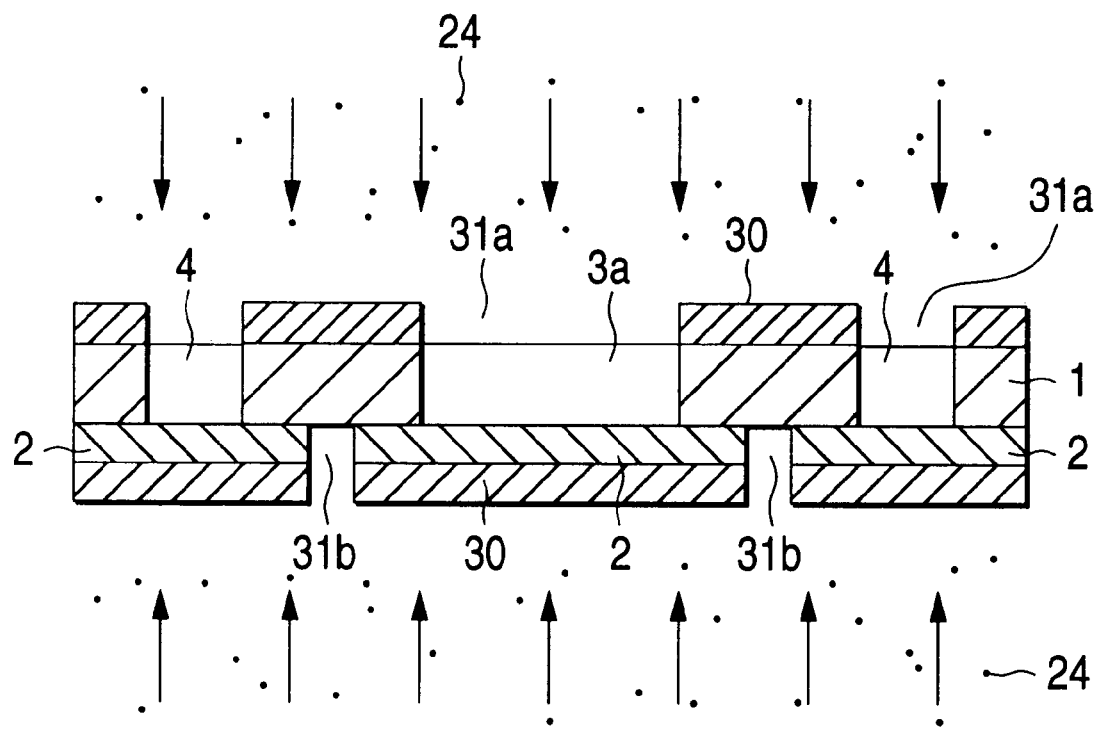
FIG. 23 is a section view of an opening forming step employed in the sixth embodiment of a printed circuit board manufacturing method.
Figure 24:
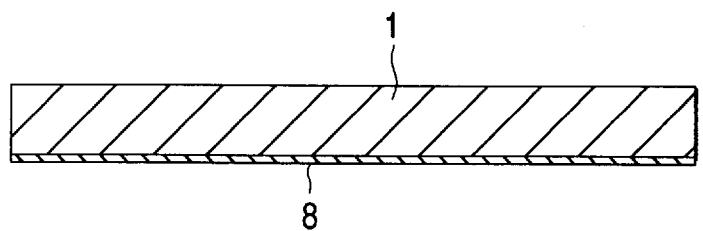
FIGS. 24(a) to (e) show a conventional method for manufacturing a printed circuit board; in particular, FIGS. 24(a) to (e) respectively section views of steps employed in the conventional method.
Figure 24:
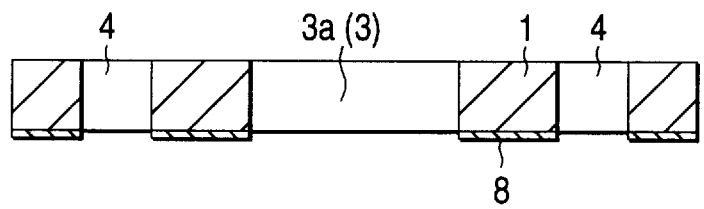
Figure 24:
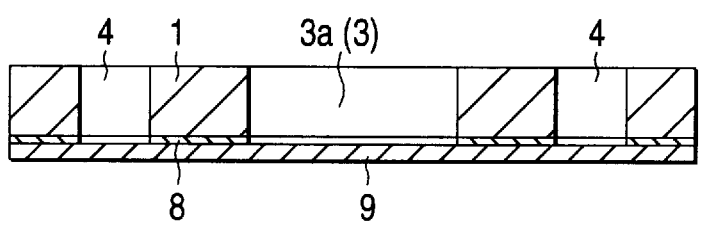
Figure 24:
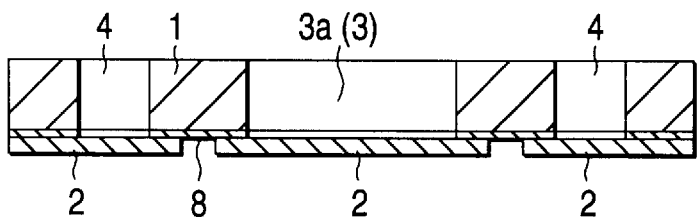
Figure 24:
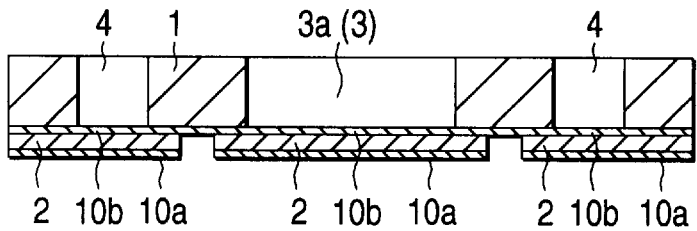

Next, as shown in FIG. 23, both surfaces of the substrate 1 are sandblasted. For example, alumina powder having a particle diameter of 5 μm is used as abrasives 24, that is, the sandblasting can be carried out by injecting the abrasives 24 with an air pressure of 5 kg/cm$^2$ for several minutes by a sandblasting device. If the abrasives 24 are injected to thereby sandblast the surfaces of the substrate 1 in this manner, as shown in FIG. 22(c), not only the abrasives 24 are caused to act through the openings 31a onto the portions of the substrate 1 that are not covered with the blasting resists 30 to thereby form the openings 3a and 4 in the substrate 1, but also the abrasives 24 are caused to act through the openings 31b onto the metal foil 9 portions corresponding to the portions of the substrate 1 that are not covered with the blasting resists 30 to thereby work the metal foil 9 for circuit configuration so that the contact terminals 2 can be formed thereon. Since the sandblasting is an anisotropic working in which only the surfaces that the abrasives 24 collide with are to be worked, the resin used in the inner peripheral surfaces of the openings 3a and 4 can be prevented against damage.

After the sandblasting is executed to thereby form the contact terminals 2 and openings 3a, 4 in the substrate 1 in the above-mentioned manner, as shown in FIG. 22(d), the exposed outer surfaces of the contact terminals 2 are respectively plated with Ni and glossy AU to thereby form finishing platings 10a thereon, next, plating resists are respectively bonded to the exposed outer surfaces of the contact terminals 2 and the surfaces of the contact terminals 2 facing the bottom portions of the openings 3a and 4 are respectively plated with Ni and non-glossy Au to thereby form such finishing platings 10b as shown in FIG. 22(e), and the plating resists are then removed, thereby being able to complete or finish a printed circuit board A.

According to a first aspect of the present invention, there is provided a method for manufacturing a printed circuit board including a substrate including a part loading portion into which an electronic part to be loaded;

a plurality of circuit patterns respectively formed on one surface of the substrate, and the surfaces of said circuit patterns exposed to the outside to serve as external contacts, and each of the circuit patterns formed of a metal foil directly and closely attached to the substrate; and openings, respectively formed in the other surface of the substrate, for connecting the electronic part to the circuit patterns, comprising the steps of:

forming the openings by one of an optical beam and sandblasting in the substrate on the back surface side of the contact terminal; and applying an ultraviolet laser at the surface of the metal foil at the opening side so as to eliminate a residual refuse.

According to the second aspect of the present invention, the opening is for insertion of a bonding wire.

According to the third aspect of the present invention, the opening is for filling with a solder to form a solder ball.

According to the fourth aspect of the present invention, as an optical laser, there is used a $CO_2$ laser.

According to the fifth aspect of the present invention, there is used a substrate with both surfaces thereof coated with metal foils, and, after one metal foil is etched to thereby form an opening, a $CO_2$ laser having a beam larger in diameter than the opening is radiated onto the opening portion to thereby form openings in the substrate.

According to the sixth aspect of the present invention, there is used a substrate with a close contact surface thereof coated with an oxidation treated metal foil or close a contact surface thereof performed with roughness treatment with an oxidation treaded metal foil.

According to the seventh aspect of the present invention, in order to form the openings by irradiating $CO_2$ laser on one surface of the substrate, the surface of the metal foil on the other surface of the substrate includes at least one of a heat sink or a cooling tube.

According to the eighth aspect of the present invention, when a $CO_2$ laser is radiated onto the substrate to thereby form the openings, a beam attenuating filter is disposed in the center of the beam optical path.

According to the ninth aspect of the present invention, the excimer laser is applied to the openings while monitoring the reflected light thereof.

According to the tenth aspect of the present invention, the openings are treated with plasma.

According to the eleventh aspect of the present invention, the openings are treated by sandblasting.

According to the twelfth aspect of the present invention, there is used a substrate with metal foils coated thereon, one or more of SHG-YAG laser, THG-YAG laser, SHG-YLF laser, and THG-YLF laser are applied to the substrate to thereby form openings, and the metals foils are worked for circuit configuration to thereby form contact terminals.

What is claimed is:

1. A method for manufacturing a printed circuit board comprising:

a circuit pattern formed by directly and closely attaching a metal foil on at least one surface of the circuit board;

openings, respectively formed from the other surface of the circuit board, for electrically connecting said circuit pattern therethrough, comprising the steps of:

forming the openings from a side of the other surface of the circuit board; and smoothing a surface of the metal foil at the opening side by an ultraviolet laser.

2. A method for manufacturing a printed circuit board, as claimed in claim 1, wherein the opening is for insertion of a bonding wire.

3. A method for manufacturing a printed circuit board as claimed in claim 1, having a substrate wherein both surfaces of said substrate are coated with metal foils, and further comprising:

etching one metal foil to form an opening; and irradiating a $CO_2$ laser having a beam larger in diameter than the opening onto the opening portion to form openings in the substrate.

4. A method for manufacturing a printed circuit board as claimed in claim 1, further comprising:

cooling member disposed on the surface of the metal foil on the other surface of the substrate, said cooling member including at least one of a heat sink and a cooling tube.

5. A method for manufacturing a printed circuit board as claimed in claim 1, wherein the excimer laser is applied to the openings while monitoring the reflected light thereof.

6. A method for manufacturing a printed circuit board as claimed in claim 1, wherein the openings are treated with plasma.

7. A method for manufacturing a printed circuit board as claimed in claim 1, wherein, the openings are treated by sandblasting.

8. A method for manufacturing, a printed circuit board as claimed in claim 1, wherein said board comprises a substrate with at least one contact surface, said method further comprising a step selected from coating said contact surface with an oxidation treated metal foil or roughening said contact surface.

9. A method for manufacturing a printed circuit board comprising:

a circuit pattern formed by directly and closely attaching a metal foil on at least one surface of the circuit board;

openings, respectively formed from the other surface of the circuit board, for electrically connecting said circuit pattern therethrough by filling at least some of said openings with a solder to form a solder ball, comprising the steps of:

forming the openings from a side of the other surface of the circuit board, and smoothing a surface of the metal foil at the opening side by an ultraviolet laser.

10. A method for manufacturing a printed circuit board comprising:

a circuit pattern formed by directly and closely attaching a metal foil on at least one surface of the circuit board;

openings, respectively formed from the other surface of the circuit board, for electrically connecting said circuit pattern therethrough comprising the steps of:

forming the openings from the side of the other surface of the circuit board, using a $CO_2$ laser; and smoothing a surface of the metal foil at the opening, side by an ultraviolet laser.

11. A method for manufacturing a printed circuit board having, a substrate said board comprising:

a circuit pattern formed by directly and closely attaching a metal foil on a first surface of the circuit board;

openings, respectively formed from the other surface of the circuit board, for electrically connecting said circuit pattern therethrough, comprising the steps of:

forming the openings from the side of the other surface of the circuit board using the optical beam from a laser with a beam attenuating filter disposed in the center of the optical beam path; and smoothing a surface of the metal foil at the opening side by an ultraviolet laser.

12. A method for manufacturing a printed circuit board having a substrate said board comprising:

a circuit pattern formed by directly and closely attaching a metal foil on at least one surface of the circuit board;

openings, respectively formed from the other surface of the circuit board, for electrically connecting said circuit pattern therethrough, comprising the steps of:

forming the openings from the side of the other surface of the circuit board using a laser selected from a SHG-YAG laser, a THG-YAG laser, a SHG-YAF laser or a SHG-YLF laser;

smoothing a surface of the metal foil at the opening, side by an ultraviolet laser; and forming a circuit configuration on the metals foil to thereby form contact terminals.

* * * * *